United States Patent [19]
Kumagai

[11] Patent Number: 5,692,869
[45] Date of Patent: Dec. 2, 1997

[54] APPARATUS FOR TRANSFERRING SEMICONDUCTOR SILICON WAFERS

[75] Inventor: Chiaki Kumagai, Kokubunji, Japan

[73] Assignees: Nakajima M.F.G. Inc., Saitama-ken, Japan; Kyowa Engineering Yugen Kaisha, Chiba-ken, Japan

[21] Appl. No.: 650,376

[22] Filed: May 20, 1996

[30] Foreign Application Priority Data

Sep. 21, 1995  [JP]  Japan ..................... 7-267852

[51] Int. Cl.$^6$ ........................... B65G 65/00
[52] U.S. Cl. .................. 414/404; 414/417; 414/938; 414/941
[58] Field of Search ...................... 414/404, 417, 414/938, 941

[56] References Cited

U.S. PATENT DOCUMENTS

| | | | |
|---|---|---|---|
| 4,573,851 | 3/1986 | Butler | 414/404 |
| 4,611,966 | 9/1986 | Johnson | 414/404 |
| 4,952,115 | 8/1990 | Ohkase | 414/404 X |
| 4,987,407 | 1/1991 | Lee | 414/404 X |
| 5,007,788 | 4/1991 | Asano et al. | 414/404 X |
| 5,125,784 | 6/1992 | Asano | 414/404 |
| 5,188,499 | 2/1993 | Tarng et al. | 414/404 |
| 5,193,969 | 3/1993 | Rush et al. | 414/404 |
| 5,299,901 | 4/1994 | Takayama | 414/404 |
| 5,501,568 | 3/1996 | Ono | 414/404 X |
| 5,620,295 | 4/1997 | Nishi | 414/404 X |

FOREIGN PATENT DOCUMENTS 6-95548  11/1994  Japan.

Primary Examiner—David A. Bucci
Attorney, Agent, or Firm—Frishauf, Holtz, Goodman, Langer & Chick

[57] ABSTRACT

An apparatus for transferring in a lump a plurality of semiconductor silicon wafers (3) from a first cassette (4), which contains the wafers inserted therein, to a second cassette (5), which comprises: a push-rod (10), a wafer loading device (11 or 19), a holding mechanism (12) and a cassette replacing mechanism (14). The push-rod (10) pushes out in a lump the wafers (3) upward from the first cassette (4), and inserts in a lump the wafers (3) thus pushed out upward into the second cassette (5). The wafer loading device (11 or 19) is releasably fitted to the uppermost end (10a) of the push-rod (10), and has a plurality of parallel grooves (11a or 20c) for receiving the wafers (3). The holding mechanism (12) grips the wafer loading device (11 or 19) without coming into contact with the wafers (3) so as to hold the wafers (3) at a prescribed position through the wafer loading device (11 or 19). The cassette replacing mechanism (14) replaces the first cassette (4) with the second cassette (5) while the wafers (3) are held at the prescribed position.

6 Claims, 10 Drawing Sheets

1

APPARATUS FOR TRANSFERRING SEMICONDUCTOR SILICON WAFERS

REFERENCE TO PATENTS, APPLICATIONS AND PUBLICATIONS PERTINENT TO THE INVENTION

As far as we know, there is available the following prior art document pertinent to the present invention:

Japanese Patent Publication No. 6-95,548 published on Nov. 24, 1994.

The contents of the prior art disclosed in the above-mentioned prior art document will be discussed under the heading "BACKGROUND OF THE INVENTION."

BACKGROUND OF THE INVENTION

(Field of the Invention)

The present invention relates to an apparatus for transferring in a lump a plurality of semiconductor silicon wafers from a cassette, i.e., a first cassette, which contains the wafers inserted therein vertically and in parallel with each other, to another cassette, i.e., a second cassette.

RELATED ART STATEMENT

In general, an integrated circuit is manufactured by cutting a columnar ingot comprising silicon semiconductor crystals in a radial direction thereof to prepare a plurality of disk-shaped thin wafers, and sequentially applying a plurality of prescribed steps of treatment to each of the thus prepared wafers.

The plurality of wafers obtained by cutting the ingot comprising the silicon semiconductor crystals as described above, are divided into a plurality of lots each comprising a prescribed number of wafers, and for each of such lots, the prescribed number of wafers are inserted vertically and in parallel with each other into a cassette. The cassette into which the prescribed number of wafers have thus been inserted, is transported to a prescribed position on a manufacturing line to sequentially apply the above-mentioned plurality of prescribed steps of treatment to these wafers.

At the prescribed position on the manufacturing line, however, it is necessary to transfer the wafers inserted into a cassette, i.e., a first cassette to another cassette, i.e., a second cassette. For example, a rinsing treatment is applied to the wafers after a developing treatment thereof. When carrying out the rinsing treatment, it is necessary to insert the wafers into a cassette specially designed for the rinsing treatment, which is excellent in heat resistance and chemicals resistance. After the completion of the rinsing treatment, furthermore, the rinsed wafers should be transferred to another clean cassette.

In view of the circumstances as described above, Japanese Patent Publication No. 6-95,548 published on Nov. 24, 1994 discloses an apparatus for transferring in a lump a plurality of semiconductor silicon wafers from a first cassette, which contains the wafers inserted therein vertically and in parallel with each other, to a second cassette (hereinafter referred to as the "prior art 1."

The apparatus of the prior art 1 for transferring semiconductor silicon wafers is described below with reference to FIGS. 11 to 14.

FIGS. 11(a) to (f) are schematic descriptive views illustrating steps for transferring in a lump the wafers, which have been inserted into a first cassette, to a second cassette by the use of an apparatus of the prior art 1; FIG. 12 is a perspective view illustrating a cassette; FIG. 13 is a schematic partial perspective view illustrating a wafer loading means in the apparatus of the prior art 1; and FIG. 14 is a schematic partial side view illustrating a loaded state of the wafers onto the wafer loading means shown in FIG. 13.

As shown in FIGS. 11(a) to (f), the apparatus A of the prior art 1 for transferring the wafers 3 from the first cassette 4, which contains the wafers 3 inserted therein vertically and in parallel with each other, to the second cassette 5, comprises a push-rod 1, a wafer loading means 1a, a holding mechanism 2 and a cassette replacing mechanism (not shown).

The first cassette 4 and the second cassette 5 are identical in their shapes. More specifically, as shown in FIG. 12, the top of each of the first cassette 4 and the second cassette 5 is open, and there is formed an opening 4c or 5c in the bottom of each cassette, through which the push-rod 1 is moved up and down. A plurality of grooves 4b or 5b, into which the wafers 3 are to be inserted vertically and in parallel to each other, are formed on both side walls 4a or 5a of each of the first cassette 4 and the second cassette 5.

The push-rod 1 is moved up and down through the opening 4c or 5c formed in the bottom of the first cassette 4 or the second cassette 5 by the action of an actuator (not shown) such as a hydraulic cylinder, a pneumatic cylinder or a servomotor provided at a center portion of a base (not shown), thereby pushing out in a lump the wafers 3 upward from the first cassette 4 and inserting in a lump the wafers 3 thus pushed out upward into the second cassette 5.

The wafer loading means 1a is fixed onto the uppermost end of the above-mentioned push-rod 1 and has a plurality of parallel grooves 1b for receiving lower portions of the wafers 3 on an upper face thereof. As shown in FIG. 14, each of the plurality of parallel grooves has a width slightly larger than the thickness of each of the wafers 3, thereby facilitating the receiving of the wafers 3 into the plurality of parallel grooves 1b.

As shown in FIGS. 11(a) to (f), the holding mechanism 2 comprises a pair of supporting arms 2a, and an actuator (not shown) such as a hydraulic cylinder, a pneumatic cylinder or a servomotor for horizontally and reciprocatively moving the pair of supporting arms 2a so that the respective free ends whereof are brought closer to or apart from each other. A plurality of parallel grooves 2b for receiving both side portions of the wafers 3 are formed on mutually facing inner faces of the free ends of the pair of supporting arms 2a, just as the plurality of parallel grooves 1b on the wafer loading means 1a. Therefore, the wafers 3 pushed out upward from the first cassette 4 are held at a prescribed position by bringing the free ends of the pair of supporting arms 2a of the holding mechanism 2 closer to each other and gripping the both side portions of the wafers 3 between the plurality of parallel grooves 2b of the pair of supporting arms 2a, when the push-rod 1 is moved up to the highest position thereof in a state in which the wafer loading means 1a receives the wafers 3.

The cassette replacing mechanism (not shown) comprises an actuator such as a hydraulic cylinder, a pneumatic cylinder or a servomotor. The cassette replacing mechanism replaces the first cassette 4 with the second cassette 5 while the wafers 3 are held at the prescribed position by means of the holding mechanism 2. More specifically, the cassette replacing mechanism causes the first cassette 4 to reciprocatively move between a position on a side of the upper face of the base (hereinafter referred to as the "first cassette standby position") and a center position on the upper face of the base (hereinafter referred to as the "replacing position" and causes the second cassette 5 to reciprocatively move between a position on the other side of the upper face of the base (hereinafter referred to as the "second cassette standby position") and the above-mentioned replacing position.

Now, steps for transferring in a lump the wafers 3 from the first cassette 4, which contains the wafers 3 inserted therein, to the second cassette 5 by the use of the above-mentioned apparatus A of the prior art 1 are described below with reference to FIGS. 11(a) to (f).

A plurality of wafers 3 after the completion of a prescribed treatment are inserted vertically and in parallel with each other into the first cassette 4. The first cassette 4 into which the wafers 3 have thus been inserted is transported to the first cassette standby position on the base. The thus transported first cassette 4 is then moved, as shown in FIG. 11(a), from the first cassette standby position to the replacing position by means of the cassette replacing mechanism (not shown). In this stage, the push-rod 1 is moved down to the lowermost position thereof, as shown in FIG. 11 (a), and the uppermost end of the push-rod 1 and the wafer loading means 1a are positioned below the opening in the upper face of the base.

Then, the push-rod 1 is moved up to cause the plurality of parallel grooves 1b of the wafer loading means 1a fixed onto the uppermost end of the push-rod 1 to receive the lower portions of the wafers 3 (refer to FIG. 11(b)). In this state, the push-rod 1 is further moved up to push out in a lump the wafers 3 upward from the first cassette 4 to a prescribed position (refer to FIG. 11(c)).

Then, the holding mechanism 2 is operated to bring the free ends of the pair of supporting arms 2a closer to each other, so as to grip the both side portions of the wafers 3 between the plurality of parallel grooves 2b on the free ends of the pair of supporting arms 2a. The wafers 3 pushed out upward from the first cassette 4 are thus held at the prescribed position (refer to FIG. 11(d)).

Then, the push-rod 1 is moved down, together with the wafer loading means 1a, to the lowermost position thereof. Then, the first cassette 4 is moved from the replacing position to the first cassette standby position by means of the cassette replacing mechanism, and then, a vacant second cassette 5 is moved from the second cassette standby position to the replacing position by means of the cassette replacing mechanism, thereby replacing the first cassette 4 with the second cassette 5 (refer to FIG. 11(d)).

Then, the push-rod 1 is moved up again to receive the lower portions of the wafers 3 held at the above-mentioned prescribed position into the plurality of parallel grooves 1b of the wafer loading means 1a fixed onto the uppermost end of the push-rod 1 (refer to FIG. 11(e)). In this state, the holding mechanism 2 is operated to bring the free ends of the pair of supporting arms 2a apart from each other, thereby releasing the gripping of the both side portions of the wafers 3 by means of the free ends of the pair of supporting arms 2a (refer to FIG. 11(e)).

Then, in the state in which the lower portions of the wafers 3 are received into the plurality of parallel grooves 1b of the wafer loading means 1a, the push-rod 1 is moved down together with the wafer loading means 1a to insert in a lump the wafers 3 into the plurality of parallel grooves 5b of the second cassette 5. Then, the push-rod 1 is further moved down together with the wafer loading means 1a to the lowermost position thereof, thereby transferring in a lump the wafers 3 from the first cassette 4 to the second cassette 5 (refer to FIG. 11(f)).

According to the above-mentioned apparatus A of the prior art 1 each of the plurality of parallel grooves 1b formed on the wafer loading means 1a has a width slightly larger than the thickness of the wafers 3 as described above. As a result, it is possible to easily carry out the receiving of the wafers 3 into the plurality of parallel grooves 1b and the withdrawing thereof from the plurality of parallel grooves 1b. The apparatus A of the prior art 1 has however the following problems:

(1) When moving up or moving down the push-rod 1 in the state in which the lower portions of the wafers 3 are received in the plurality of parallel grooves 1b of the wafer loading means 1a, vibration of the push-rod 1, if any, causes an unstable fine vibration of the wafers 3 in the plurality of parallel grooves 1b, resulting in the production of dust caused by the friction between the lower portions of the wafers 3 and the wafer loading means 1a. Particularly, the amount of produced dust caused by the unstable fine vibration mentioned above of the wafers 3, tends to increase according as the outside diameter of the wafers 3 becomes larger (hereinafter referred to as the "problem 1 of the prior art 1").

(2) By considerably reducing the ascending speed or the descending speed of the push-rod 1, it is possible to inhibit the above-mentioned vibration of the push-rod 1, so as to prevent the production of dust. When considerably reducing the ascending speed or the descending speed of the push-rod 1, however, the fabrication efficiency of the semiconductor silicon wafers seriously decreases (hereinafter referred to as the "problem 2 of the prior art 1").

(3) The above-mentioned amount of produced dust increases in proportion to the receiving frequency of the wafers 3 into the plurality of parallel grooves 1b of the wafer loading means 1a and the withdrawing frequency of the wafers 3 from the plurality of parallel grooves 1b. When transferring the wafers 3 from the first cassette 4 to the second cassette 5 by the use of the apparatus A of the prior art 1 the receiving frequency of the wafers 3 into the plurality of parallel grooves 1b and the withdrawing frequency of the wafers 3 from the plurality of parallel grooves 1b are twice in the both cases, suggesting a large amount of produced dust (hereinafter referred to as the "problem 3 of the prior art 1").

(4) In addition, dust is produced as well when gripping the both side portions of the wafers 3 between the plurality of parallel grooves 2b of the free ends of the pair of supporting arms 2a of the holding mechanism 2, and when releasing the gripping of the wafers 3 by means of the holding mechanism 2. In the prior art 1 therefore, in addition to the production of dust caused by the contact between the wafer loading means 1a and the wafers 3, dust is produced also as a result of contact between the free ends of the pair of supporting arms 2a of the holding mechanism 2 and the wafers 3 (hereinafter referred to as the "problem 4 of the prior art 1").

With a view to solving the problems 1 and 2 of the prior art 1 there has so far been proposed an improved wafer loading means which is fixed onto the uppermost end of the push-rod 1 of the prior art 1 (hereinafter referred to as the "prior art 2"). The improved wafer loading means of the prior art 2 is described with reference to FIGS. 15 and 16.

FIG. 15 is a schematic plan view illustrating an improved wafer loading means of the prior art 2; and FIG. 16 is a schematic side view illustrating the improved wafer loading means shown in FIG. 15.

As shown in FIGS. 15 and 16, the improved wafer loading means 6 of the prior art 2 comprises a grip body 7, a sliding plate 8 and a sliding plate moving means (not shown).

The grip body 7 comprises a bottom plate and a pair of guide blocks 7a formed on the both sides of the bottom plate so as to project upward therefrom. A plurality of parallel grooves 7b are formed at equal intervals and at equal pitches on each of the pair of guide blocks 7a. The plurality of parallel grooves 7b formed on one of the pair of guide blocks 7a align with the plurality of parallel grooves 7b formed on the other one of the pair of guide blocks 7a. Each of the plurality of parallel grooves 7b has a width slightly larger than the thickness of the wafers 3, thus facilitating the receiving of the wafers 3 into the plurality of parallel grooves 7b.

The sliding plate 8 is arranged slidably in a direction at right angles to the plurality of parallel grooves 7b of the above-mentioned grip body 7 between the pair of guide blocks 7a of the grip body 7. As shown in FIG. 15, a plurality of similar parallel grooves 8b are formed on the sliding plate 8 at positions corresponding to the plurality of parallel grooves 7b of the pair of guide blocks 7a of the grip body 7. Each of the plurality of parallel grooves 8b formed on the sliding plate 8a also has a width slightly larger than the thickness of the wafers 3, thus making it easy to receive the wafers 3 into the plurality of parallel grooves 8b. In the sliding plate 8, one of both side walls 8a of each of the plurality of parallel grooves 8b comes into contact with a surface of each wafer 3 to serve as a pressing member which imparts a prescribed pressing force to each wafer 3.

The sliding plate moving means (not shown) comprises an actuator such as a hydraulic cylinder, a pneumatic cylinder or a servomotor fitted to the grip body 7, and causes the sliding plate 8 to slide in the longitudinal direction thereof.

The wafer loading means 6 described above is used as follows: The sliding plate moving means (not shown) is operated to cause the sliding plate 8 to slide in the arrow B direction in FIG. 15, so as to align the plurality of parallel grooves 8b of the sliding plate 8 with the plurality of parallel grooves 7b of the pair of guide blocks 7a of the grip body 7. In this state, the wafers 3 are received into the plurality of parallel grooves 8b of the sliding plate 8 and the plurality of parallel grooves 7b of the pair of guide blocks 7a. Then, the sliding plate moving means is operated to cause the sliding plate 8 to slide in the arrow A direction in FIG. 15, so as to press one of both side walls 8a of each of the plurality of parallel grooves 8b of the sliding plate 8 against a surface of each wafer 3, thereby gripping the wafers 3 with a prescribed pressing force in the plurality of parallel grooves 8b of the sliding plate 8 and the plurality of parallel grooves 7b of the pair of guide blocks 7a of the grip body 7.

According to the above-mentioned improved wafer loading means 6 of the prior art 2, the problems 1 and 2 of the prior art 1 can theoretically be solved; since, in the state in which one of both side walls 8a of each of the plurality of parallel grooves 8b of the sliding plate 8 is pressed against a surface of each wafer 3, the wafers 3 are gripped with a prescribed pressing force in the plurality of parallel grooves 8b of the sliding plate 8 and the plurality of parallel grooves 7b of the pair of guide blocks 7a of the grip body 7.

However, the wafers 3 are very brittle and have a very small thickness as about 0.3 mm. In order that the above-mentioned wafer loading means 6 can appropriately display its functions, therefore, the width of each of the plurality of parallel grooves 7b of the pair of guide blocks 7a should accurately be equal to the width of each of the plurality of parallel grooves 8b of the sliding plate 8, and in addition, the pitch of the grooves 7b should accurately agree with the pitch of the grooves 8b. For example, if the second groove 8b' from left in FIG. 15 of the plurality of parallel grooves 8b of the sliding plate 8 has a width larger even slightly than the width of the other grooves 8b, one 8a' of both side walls 8a of the second groove 8b' from left is not brought into contact with the lower portion of one wafer 3, although the lower portions of the first, third, fourth and fifth wafers 3 from left in FIG. 15 are appropriately gripped, the second wafer 3 is not gripped, and as a result, all the wafers 3 cannot be appropriately gripped. If the width of any one of the plurality of parallel grooves 8b of the sliding plate 8 is even slightly smaller than the width of the other grooves 8b, on the other hand, it is possible to grip one wafer 3, but it is impossible to grip the other wafers 3.

As is clear from the above description, a very strict accuracy is required when fabricating the plurality of parallel grooves 7b of the pair of guide blocks 7a and the plurality of parallel grooves 8b of the sliding plate 8 in the improved wafer loading means 6 of the prior art 2. It is however very difficult to make fabrication at such a very strict accuracy. When there occurs any error in fabrication of the pair of guide blocks 7a and/or the sliding plate 8, the correction thereof requires much time and costs. In view of these actual circumstances, the above-mentioned fabrication at such a very strict accuracy as described above is practically impossible (hereinafter referred to as the "problem of the prior art 2").

SUMMARY OF THE INVENTION

An object of the present invention is therefore to provide an apparatus for transferring in a lump a plurality of semiconductor silicon wafers from a first cassette, which contains the wafers inserted therein vertically and in parallel with each other, to a second cassette, wherein at least the problems 3 and 4 of the prior art 1 can be solved by minimizing the receiving frequency of the wafers into a wafer loading means, the withdrawing frequency of the wafers from the wafer loading means, the gripping frequency of the wafers by means of a holding mechanism, and the releasing frequency of the gripped wafers by means of the holding mechanism, in other words, it is possible to minimize the amount of produced dust caused by friction between the wafers and the wafer loading means and friction between the wafers and the holding mechanism.

Another object of the present invention is to provide an apparatus for transferring in a lump a plurality of semiconductor silicon wafers from a first cassette, which contains the wafers inserted therein vertically and in parallel with each other, to a second cassette, wherein at least the problems 1 and 2 of the prior art 1 and the problem of the prior art 2 can be solved by individually gripping the lower portion of each of the wafers in each of the plurality of parallel grooves of the wafer loading means, in other words, it is possible to prevent the production of dust caused by an unstable fine vibration of the wafers in the plurality of parallel grooves of the wafer loading means, and furthermore, the lower portion of each of the wafers can always be gripped under appropriate conditions in each of the plurality of parallel grooves of the wafer loading means, without the need of a very strict fabrication accuracy when fabricating the plurality of parallel grooves on the wafer loading means.

In accordance with one of the features of the present invention, in an apparatus for transferring in a lump a plurality of semiconductor silicon wafers from a first cassette, which contains said wafers inserted therein vertically and in parallel with each other, to a second cassette, which comprises:

a push-rod, movable up and down through an opening provided in a bottom of each of said first cassette and said second cassette, for pushing out in a lump said wafers upward from said first cassette, and inserting in a lump said wafers thus pushed out upward into said second cassette;

a wafer loading means, provided on the uppermost end of said push-rod, said wafer loading means having a plurality of parallel grooves for receiving lower portions of said wafers;

a holding mechanism for supporting in a lump said wafers pushed out upward by means of said push-rod, so as to hold said wafers pushed out upward from said first cassette at a prescribed position; and a cassette replacing mechanism for replacing said first cassette with said second cassette while said wafers are held at said prescribed position by means of said holding mechanism;

whereby said push-rod is moved up to push out in a lump said wafers inserted into said first cassette upward from said first cassette; then, said wafers thus pushed out upward are held at said prescribed position by means of said holding mechanism; then, said push-rod is moved down to the lowermost position thereof; then, said first cassette is replaced with said second cassette by means said cassette replacing mechanism; then, said push-rod is moved up again to receive said wafers held at said prescribed position by means of said holding mechanism through said wafer loading means; then, said holding of said wafers by means of said holding mechanism is released; and then, said push-rod is moved down again to said lowermost position thereof to insert in a lump said wafers into said second cassette, thereby transferring in a lump said wafers from said first cassette to said second cassette;

there is provided the improvement wherein:
said wafer loading means (11 or 19) is releasably fitted onto said uppermost end (10a) of said push-rod (10), and said push-rod (10) is moved down while said wafers (3) are held at said prescribed position to separate said wafer loading means (11 or 19) from said uppermost end (10a) of said push-rod (10); and said holding mechanism (12) grips said wafer loading means (11 or 19) without coming into direct contact with said wafers (3), to hold said wafers (3) at said prescribed position (hereinafter referred to as the "first invention").

In accordance with another one of the features of the present invention, in an apparatus for transferring in a lump a plurality of semiconductor silicon wafers from a first cassette, which contains said wafers inserted therein vertically and in parallel with each other, to a second cassette, which comprises:

a push-rod, movable up and down through an opening provided in a bottom of each of said first cassette and said second cassette, for pushing out in a lump said wafers upward from said first cassette, and inserting in a lump said wafers thus pushed out upward into said second cassette;

a wafer loading means, fixed onto the uppermost end of said push-rod, said wafer loading means having a plurality of parallel grooves for receiving lower portions of said wafers;

a holding mechanism for supporting in a lump said wafers pushed out upward by means of said push-rod, so as to hold said wafers pushed out upward from said first cassette at a prescribed position; and a cassette replacing mechanism for replacing said first cassette with said second cassette while said wafers are held at said prescribed position by means of said holding mechanism;

whereby said push-rod is moved up to push out in a pump said wafers inserted into said first cassette upward from said first cassette; then, said wafers thus pushed out upward are held at said prescribed position by means of said holding mechanism; then, said push-rod is moved down to the lowermost position thereof; then, said first cassette is replaced with said second cassette by means of said cassette replacing mechanism; then, said push-rod is moved up again to receive said wafers held at said prescribed position by means of said holding mechanism through said wafer loading means; then, said holding of said wafers by means of said holding mechanism is released; and then, said push-rod is moved down again to said lowermost position thereof to insert in a lump said wafers into said second cassette, thereby transferring in a lump said wafers from said first cassette to said second cassette;

there is provided the improvement wherein:
said wafer loading means (19) comprises a grip body (20) having said plurality of parallel grooves (20c) on an upper face thereof, a sliding plate (21) fitted to said grip body (20) slidably in a direction at right angles to said plurality of parallel grooves (20c), a plurality of pressing members (22), provided on said sliding plate (21), each for pressing said lower portion of each of said wafers (3) against one of both side walls of each of said plurality of parallel grooves (20c), and a plurality of elastic means (23) each for individually imparting a pressing force to each of said plurality of pressing members (22), so as to prevent the occurrence of a fine vibration of each of said wafers (3) in each of said plurality of parallel grooves (20c)

(hereinafter referred to as the "second invention").

In the first invention, the wafer loading means (19) should preferably comprise a grip body (20) having said plurality of parallel grooves (20c) on an upper face thereof, a sliding plate (21) fitted to said grip body (20) slidably in a direction at right angles to said plurality of parallel grooves (20c), a plurality of pressing members (22), provided on said sliding plate (21), each for pressing said lower portion of each of said wafers (3) against one of both side walls of each of said plurality of parallel grooves (20c), and a plurality of elastic means (23) each for individually imparting a pressing force to each of said plurality of pressing members (22), so as to prevent the occurrence of a fine vibration of each of said wafers (3) in each of said plurality of parallel grooves (20c).

In the first and second inventions, said wafer loading means (19) should preferably be provided with a locking means (26) which holds said sliding plate (21) at a prescribed position when said sliding plate (21) has slid to said prescribed position, so as to maintain a state in which said pressing force is individually imparted to each of said plurality of pressing members (22) by means of each of said plurality of elastic means (23).

In the first invention, said wafer loading means (11 or 19) should preferably be releasably fitted onto said uppermost end (10a) of said push-rod (10) through a positioning means (24).

In the first invention, said positioning means (24) may comprise at least one hole (11b), which is formed in one side of a lower portion of said wafer loading means (11 or 19) and said uppermost end (10a) of said push-rod (10), and at least one pin (10b), which is formed on the other side of said lower portion of said wafer loading means (11 or 19) and said uppermost end (10a) of the push-rod (10), so as to be fittable into said at least one hole (11b).

DETAILED DESCRIPTION OF PREFERRED EMBODIMENTS

Figure 1:
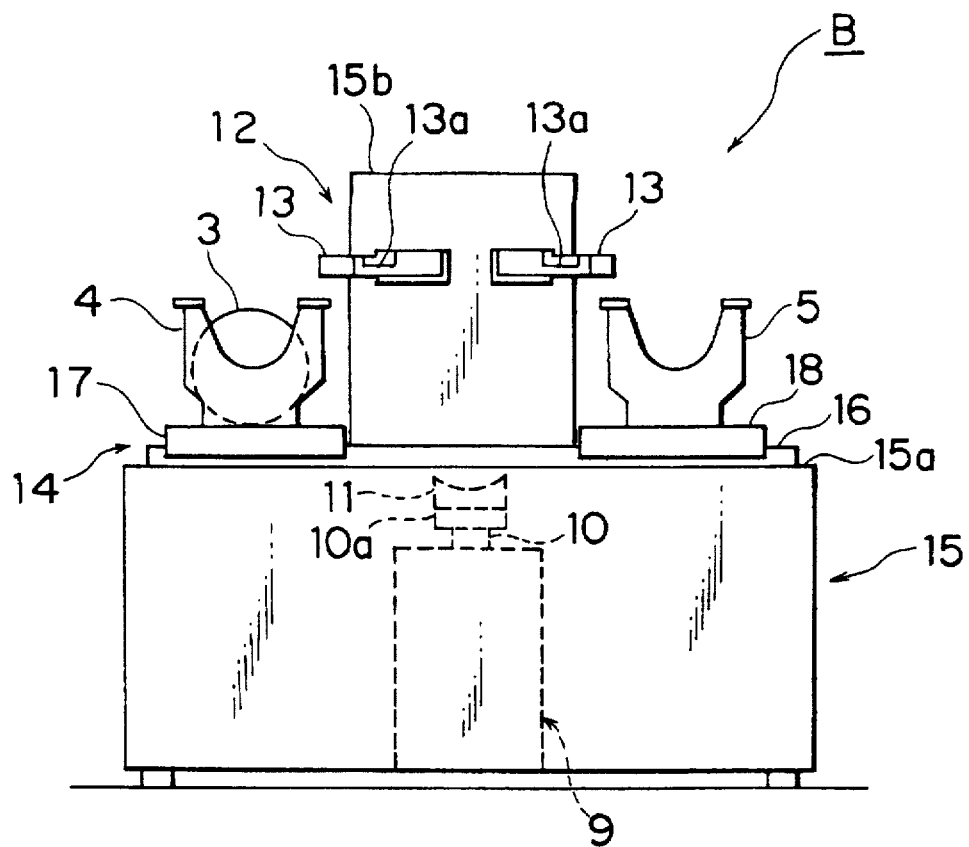
FIG. 1 is a front view illustrating an apparatus for transferring semiconductor silicon wafers according to the first invention.

From the above-mentioned point of view, extensive studies were carried out to develop an apparatus for transferring in a lump a plurality of semiconductor silicon wafers from a first cassette, which contains the wafers inserted therein vertically and in parallel with each other, to a second cassette, wherein at least the problems 3 and 4 of the prior art 1 can be solved by minimizing the receiving frequency of the wafers into a wafer loading means, the withdrawing frequency of the wafers from the wafer loading means, the gripping frequency of the wafers by means of a holding mechanism, and the releasing frequency of the gripped wafers by means of the holding mechanism, and an apparatus for transferring in a lump a plurality of semiconductor silicon wafers from a first cassette, which contains the wafers inserted therein vertically and in parallel with each other, to a second cassette, wherein at least the problems 1 and 2 of the prior art 1 and the problem of the prior art 2 can be solved by individually gripping the lower portion of each of the wafers in each of a plurality of parallel grooves of the wafer loading means.

As a result, the following findings were obtained:

(a) It is possible to minimize the receiving frequency of the wafers into the wafer loading means, the withdrawing frequency of the wafers from the wafer loading means, the gripping frequency of the wafers by means of the holding mechanism, and the releasing frequency of the gripped wafers by means of the holding mechanism by imparting the following features to the apparatus of the prior art 1:

(i) the wafer loading means is releasably fitted onto the uppermost end of a push-rod, and the push-rod is moved down while the wafers are held at a prescribed position to separate the wafer loading means from the uppermost end of the push-rod; and (ii) the holding mechanism grips the wafer loading means without coming into direct contact with the wafers, to hold the wafers at the prescribed position.

(b) It is possible to individually grip the lower portion of each of the wafers in each of a plurality of parallel grooves of the wafer loading means by imparting the following features to the apparatus of the prior art 1:

the wafer loading means comprises a grip body having a plurality of parallel grooves on an upper face thereof, a sliding plate fitted to the grip body slidably in a direction at right angles to the plurality of parallel grooves, a plurality of pressing members, provided on the sliding plate, each for pressing the lower portion of each of the wafers against one of both side walls of each of the plurality of parallel grooves, and a plurality of elastic means each for individually imparting a a pressing force to each of the plurality of pressing members, so as to prevent the occurrence of a fine vibration of each of the wafers in each of the plurality of parallel grooves.

Now, an embodiment of the apparatus according to the first invention for transferring in a lump a plurality of semiconductor silicon wafers from a first cassette, which contains the wafers inserted therein vertically and in parallel with each other, to a second cassette, is described below with reference to FIGS. 1 to 5.

Figure 2:
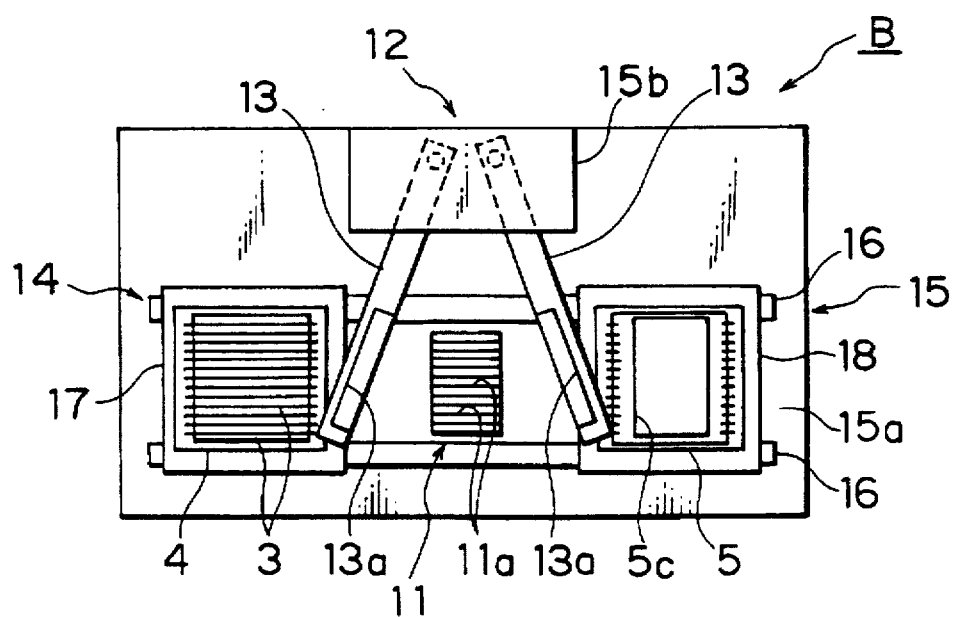
FIG. 2 is a plan view illustrating the apparatus shown in FIG. 1.
Figure 3:
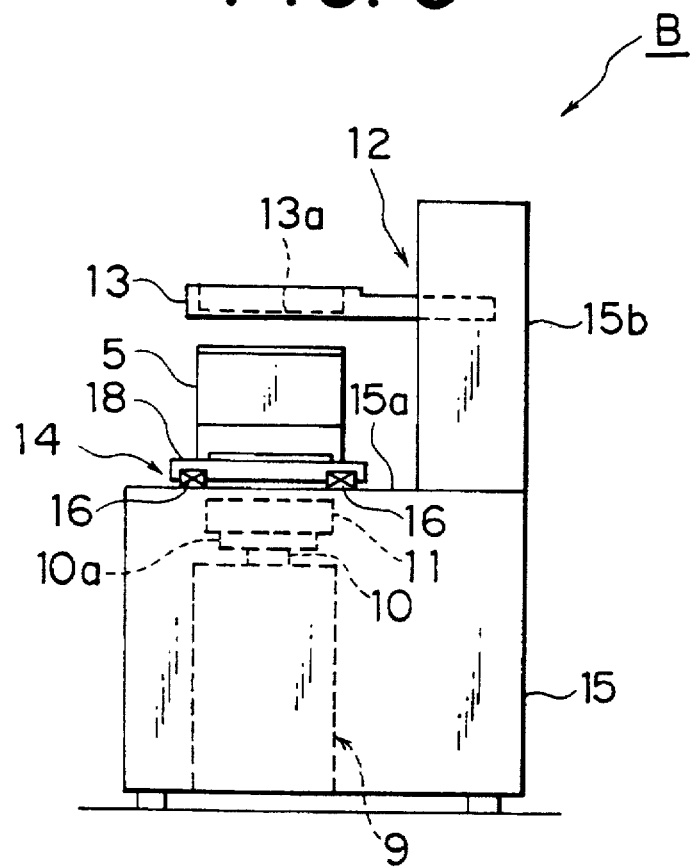
FIG. 3 is a side view illustrating the apparatus shown in FIG. 1.
Figure 4:
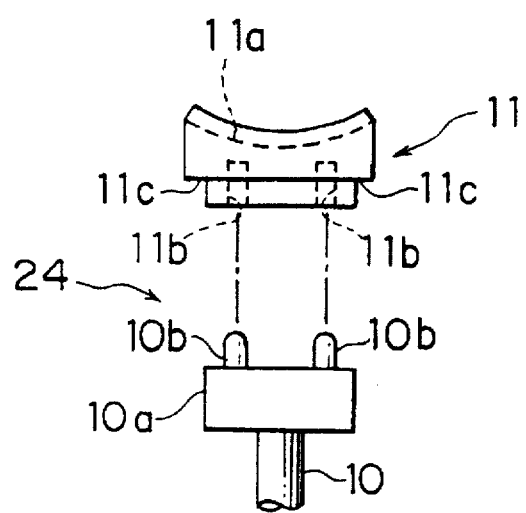
FIG. 4 is a front view illustrating a positioning means provided between the uppermost end of a push-rod and a wafer loading means in the apparatus for transferring semiconductor silicon wafers according to the first invention.
Figure 5:
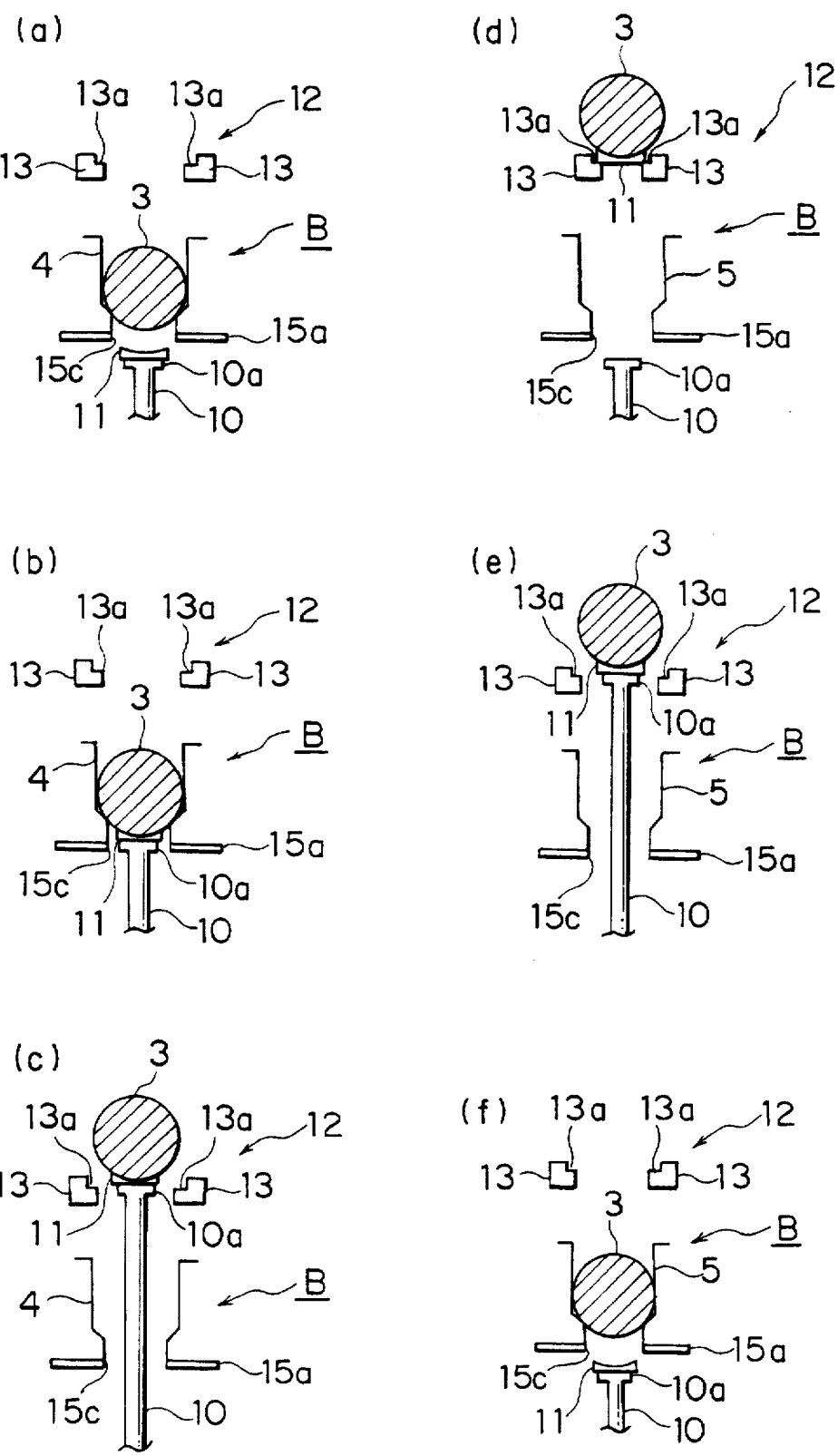
FIGS. 5(a) to (f) are schematic descriptive views illustrating steps for transferring in a lump the wafers, which have been inserted into a first cassette, to a second cassette by the use of the apparatus according to the first invention.

FIG. 1 is a front view illustrating an apparatus for transferring semiconductor silicon wafers according to the first invention; FIG. 2 is a plan view illustrating the apparatus shown in FIG. 1; FIG. 3 is a side view illustrating the apparatus shown in FIG. 1; FIG. 4 is a front view illustrating a positioning means provided between the uppermost end of a push-rod and a wafer loading means in the apparatus for transferring semiconductor silicon wafers according to the first invention; and FIGS. 5(a) to (f) are schematic descriptive views illustrating steps for transferring in a lump the wafers, which have been inserted into a first cassette, to a second cassette by the use of the apparatus according to the first invention.

The apparatus B for transferring semiconductor silicon wafers 3 according to the first invention is for transferring in a lump the wafers 3 from a first cassette 4, which contains the wafers 3 inserted therein vertically and in parallel with each other, to a second cassette 5, and comprises a push-rod 10, a wafer loading means 11, a holding mechanism 12 and a cassette replacing mechanism 14.

Figure 12:
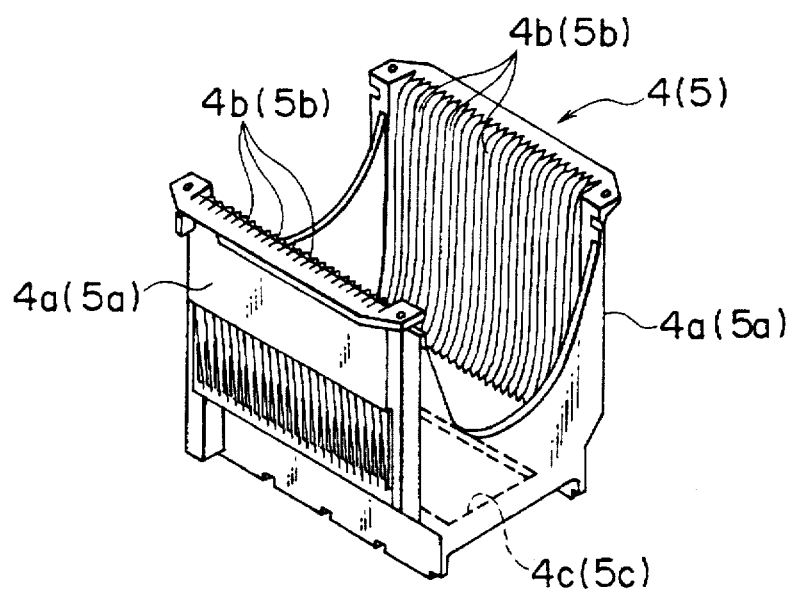
FIG. 12 is a perspective view illustrating a cassette.
Figure 13:
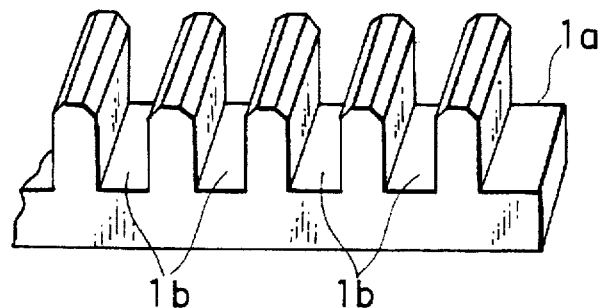
FIG. 13 is a schematic partial perspective view illustrating a wafer loading means in the apparatus of the prior art 1.
Figure 14:
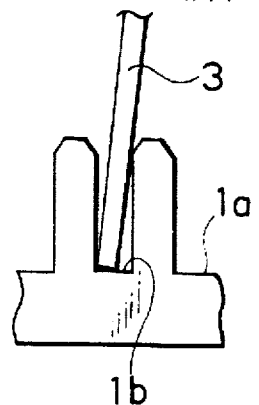
FIG. 14 is a schematic partial side view illustrating a loaded state of the wafers onto the wafer loading means shown in FIG. 13.
Figure 15:
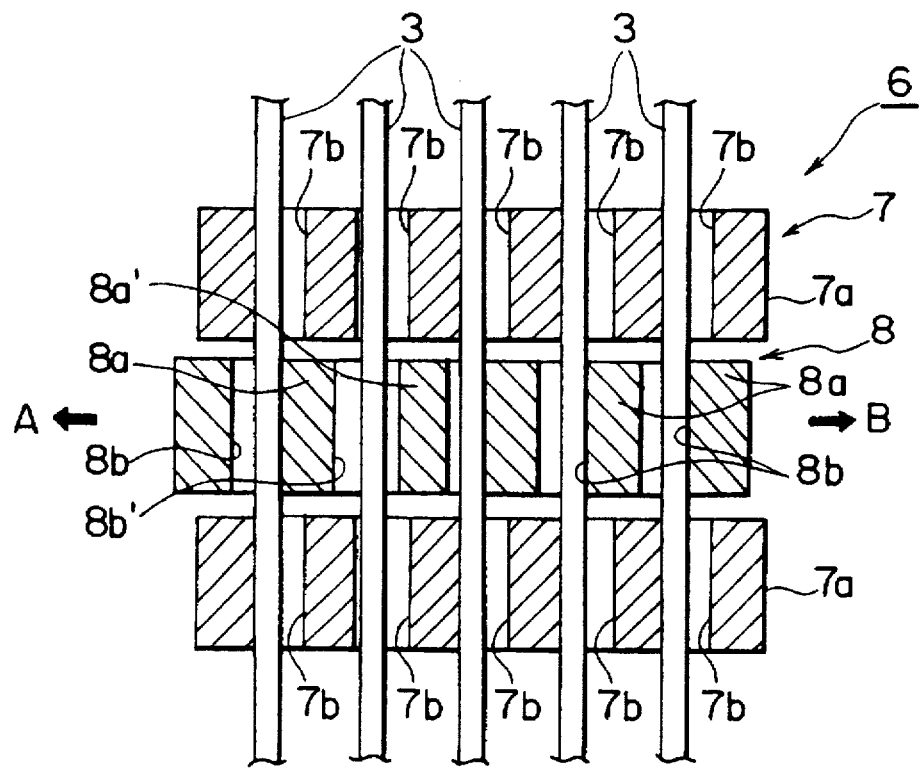
FIG. 15 is a schematic plan view illustrating an improved wafer loading means of the prior art 2.
Figure 16:
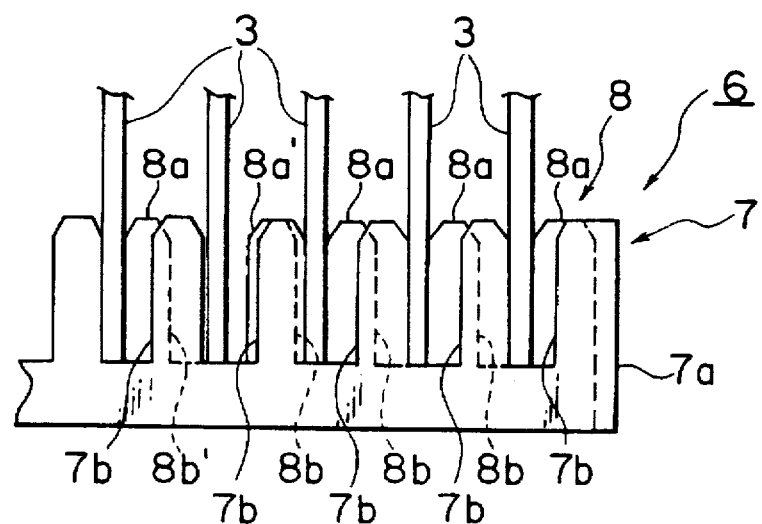
FIG. 16 is a schematic side view illustrating the improved wafer loading means shown in FIG. 15.

Since the first cassette 4 and the second cassette 5 are the same as those described above with reference to FIG. 12, description of the construction thereof is omitted here.

The push-rod 10 moves up and down, as shown in FIGS. 1 and 3, through an opening 15c (refer to FIGS. 5(a) to (f)) formed at the center of an upper face 15a of a base 15 by the action of an actuator 9 such as a hydraulic cylinder, a pneumatic cylinder or a servomotor provided on a center portion of the base 15. The push-rod 10 moves up and down, furthermore, through the opening 4c or 5c formed in the bottom of the first cassette 4 or the second cassette 5, which is arranged above the opening 15c of the base 15, also by the action of the actuator 9, thereby pushing out in a lump the wafers 3 upward from the first cassette 4 and inserting in a lump the wafers 3 thus pushed out upward into the second cassette 5.

The wafer loading means 11 has a rectangular shape passable through the opening 15c formed in the upper face 15a of the base 15, and the opening 4c or 5c formed in the bottom of the first cassette 4 or the second cassette 5. A plurality of parallel grooves 11a are formed on an upper face of the wafer loading means 11 (refer to FIG. 4). These plurality of parallel grooves 11a are formed into an arc shape agreeing with the circumference of the wafers 3 so as to permit the receiving of the lower portions of the disk-shaped wafers 3. Each of the plurality of parallel grooves 11a has a width slightly larger than the thickness of each of the wafers 3, thereby facilitating the receiving of the wafers 3 into the plurality of parallel grooves 11a. In addition, a step 11c is formed on each of the both sides of a lower portion of the wafer loading means 11, as shown in FIG. 4. The step 11c is received into a recess 13a of a free end of each of a pair of supporting arms 13 of the holding mechanism 12 described later.

The above-mentioned wafer loading means 11 is releasably fitted onto the uppermost end 10a of the push-rod 10 so as to permit the wafer loading means 11 to separate from the upper end 10a of the push-rod 10. While the wafer loading means 11 may only be placed on the uppermost end 10a of the push-rod 10, it is desirable, with a view to obtaining a stable fitted state, to form a concave on any one of a lower portion of the wafer loading means 11 and the uppermost end 10a of the push-rod 10, and to form a convex on the other one of the lower portion of the wafer loading means 11 and the uppermost end 10a of the push-rod 10 so as to be fittable into the above-mentioned concave.

For the purpose of obtaining a more stable fitted state of the wafer loading means 11 onto the upper end 10a of the push-rod 10, the wafer loading means 11 should preferably be fitted releasably onto the uppermost end 10a of the push-rod 10 through a positioning means 24 as shown in FIG. 4. The positioning means 24 comprises a plurality of holes 11b formed in the lower portion of the wafer loading means 11, and a plurality of pins 10b formed on the uppermost end 10a of the push-rod 10 so as to be fittable into the above-mentioned plurality of holes 11b. When the above-mentioned holes 11b and the pins 10b have a polygonal cross-sectional shape, the positioning means 24 may comprise a single hole 11b and a single pin 10b.

The holding mechanism 12 comprises a pair of supporting arms 13 as shown in FIGS. 1 to 3. Rear ends of the pair of supporting arms 13 are rotatably connected to a prop 15b projecting upward from the center portion of the upper face 15a of the base 15 so as to cause free ends of the pair of supporting arms 13 to reciprocatively move along a horizontal plane at a position apart by a prescribed distance upward from the upper face 15a of the base 15. A recess 13a for receiving the above-mentioned step 11c of the wafer loading means 11 is formed on a free end portion of each of the pair of supporting arms 13. The holding mechanism 12 is operated by means of an actuator (not shown) such as a hydraulic cylinder, a pneumatic cylinder or a servomotor, and this operation causes the pair of supporting arms 13 to reciprocatively move along the above-mentioned horizontal plane so that the respective free ends of the pair of supporting arms 13 come closer to each other or come apart from each other.

The cassette replacing mechanism 14 comprises a pair of parallel guide rails 16, two sliding tables 17 and 18, and a sliding table driving mechanism (not shown).

The pair of parallel guide rails 16 are arranged on the upper face 15a of the base 15 so as to put the opening 15c in between, which opening 15c is formed in the upper face 15a of the base 15.

The two sliding tables 17 and 18 are placed slidably on the pair of guide rails 16. An opening (not shown), through which the push-rod 10 moves up and down, is formed in each of the two sliding tables 17 and 18. Among the two sliding tables 17 and 18, the sliding table 17 is used for placing the first cassette 4 thereon, and the other sliding table 18 is used for placing the second cassette 5 thereon.

The sliding table driving mechanism (not shown) comprises an actuator such as a hydraulic cylinder, a pneumatic cylinder or a servomotor. The sliding table driving mechanism causes the two sliding tables 17 and 18 to slide individually on the pair of guide rails 16. More specifically, the sliding table driving mechanism causes the sliding table 17 for the first cassette 4 (hereinafter referred to as the "first sliding table 17") to reciprocatively move between a position on a side of the upper face 15a of the base 15 (hereinafter referred to as the "first cassette standby position") and a center position on the upper face 15a of the base 15 (hereinafter referred to as the "replacing position"), and causes the sliding table 18 for the second cassette 5 (hereinafter referred to as the "second sliding table 18") to reciprocatively move between a position on the other side of the upper face 15a of the base 15 (hereinafter referred to as the "second cassette standby position") and the above-mentioned replacing position.

Now, steps for transferring in a lump the wafers 3 from the first cassette 4, which contains the wafers 3 inserted therein, to the second cassette 5 by the use of the apparatus B according to the first invention, are described below with reference to FIGS. 5(a) to (f).

A plurality of wafers 3 after completion of a prescribed treatment are inserted vertically and in parallel with each other into the first cassette 4. The first cassette 4 into which the wafers 3 have thus been inserted is transported onto the first sliding table 17 placed at the first cassette standby position on the upper face 15a of the base 15. The thus transported first cassette 4 is then moved together with the first sliding table 17, as shown in FIG. 5(a), from the first cassette standby position to the replacing position by means of the cassette replacing mechanism 14 (refer to FIGS. 1 to 3). In this stage, the push-rod 10 is moved down to the lowermost position thereof as shown in FIG. 5(a), and the uppermost end 10a of the push-rod 10 and the wafer loading means 11 are positioned below the opening 15c in the upper face 15a of the base 15.

Then, the push-rod 10 is moved up to cause the plurality of parallel grooves 11a of the wafer loading means 11 fitted releasably onto the uppermost end 10a of the push-rod 10 to receive the lower portions of the wafers 3 (refer to FIG. 5(b)). In this state, the push-rod 10 is further moved up to push out in a lump the wafers 3 upward from the first cassette 4 to a prescribed position (refer to FIG. 5(c)).

Then, the holding mechanism 12 is operated to bring the free ends of the pair of supporting arms 13 closer to each other, so as to receive the steps 11c of the wafer loading means 11 into the recesses 13a of the free ends of the pair of supporting arms 13, and whereby the wafer loading means 11 having received the wafer 3 pushed out upward from the first cassette 4 is held at the prescribed position (refer to FIG. 5(d)).

Then, the push-rod 10 is moved down to separate the uppermost end 10a thereof from the wafer loading means 11 held by means of the free ends of the pair of supporting arms 13, and then, the push-rod 10 is further moved down to the lowermost position thereof. In this stage, the uppermost end 10a of the push-rod 10 is positioned below the opening 15c of the upper face 15a of the base 15. In this state, the wafers 3 pushed out upward from the first cassette 4 are held at the prescribed position by means of the free ends of the pair of supporting arms 13 through the wafer loading means 11, without coming into direct contact with the pair of supporting arms 13 (refer to FIG. 5(d)).

Then, the first cassette 4 is moved, together with the first sliding table 17, from the replacing position to the first cassette standby position by means of the cassette replacing mechanism 14, and then, a vacant second cassette 5 placed on the second sliding table 18, is moved, together with the second sliding table 18, from the second cassette standby position to the replacing position, thereby replacing the first cassette 4 with the second cassette 5 (refer to FIG. 5(d)).

Then, the push-rod 10 is moved up again to fit the pins 10b provided on the uppermost end 10a of the push-rod 10 into the holes 11b formed in the lower portion of the wafer loading means 11. In this state, the holding mechanism 12 is operated to bring the free ends of the pair of supporting arms 13 apart from each other, thereby releasing the support of the steps 11c of the wafer loading means 11 by means of the recesses 13a of the pair of supporting arms 13 (refer to FIG. 5(e)).

Then, the push-rod 10 is moved down, together with the wafer loading means 11 having received the wafers 3, to insert in a lump the wafers 3 into the plurality of parallel grooves 5b of the second cassette 5. Then, the push-rod 10 is further moved down together with the wafer loading means 11 to the lowermost position thereof. In this stage, the uppermost end 10a of the push-rod 10 is positioned, together with the wafer loading means 11, below the opening 15c of the upper face 15a of the base 15, whereby the wafers 3 are transferred in a lump from the first cassette 4 to the second cassette 5 (refer to FIG. 5(f) ).

In the apparatus B according to the first invention, as described above, the wafer loading means 11 is releasably fitted onto the uppermost end 10a of the push-rod 10. In addition, except for two steps including the first step of receiving the wafers 3 into the wafer loading means 11 and the final step of withdrawing the wafers 3 from the wafer loading means 11, the wafers 3 always move together with the wafer loading means 11, and during this move, receiving of the wafers 3 into the wafer loading means 11 and withdrawing of the wafers 3 therefrom are never carried out throughout the steps of transferring the wafers 3 from the first cassette 4, which contains the wafers 3 inserted therein, to the second cassette 5. More specifically, when transferring the wafers 3 from the first cassette 4, which contains the wafers 3 inserted therein, to the second cassette 5, the receiving frequency of the wafers 3 into the plurality of parallel grooves 11a of the wafer loading means 11 and the withdrawing frequency of the wafers 3 from the plurality of the parallel grooves 11a are only once, respectively, which represents a half of the frequency in the prior art 1. Thus, the problem 3 of the prior art 1 can be solved.

In the apparatus B according to the first invention mentioned above, furthermore, the wafers 3 pushed out upward from the first cassette 4 are held at the prescribed position by means of the pair of supporting arms 13 through the wafer loading means 11, without coming into direct contact with the pair of supporting arms 13. It is thus possible to solve the problem 4 of the prior art 1.

Now, an embodiment of the apparatus according to the second invention for transferring in a lump a plurality of semiconductor silicon wafers from a first cassette, which contains the wafers inserted therein vertically and in parallel with each other, to a second cassette, is described below with reference to FIGS. 6 to 10.

Figure 6:
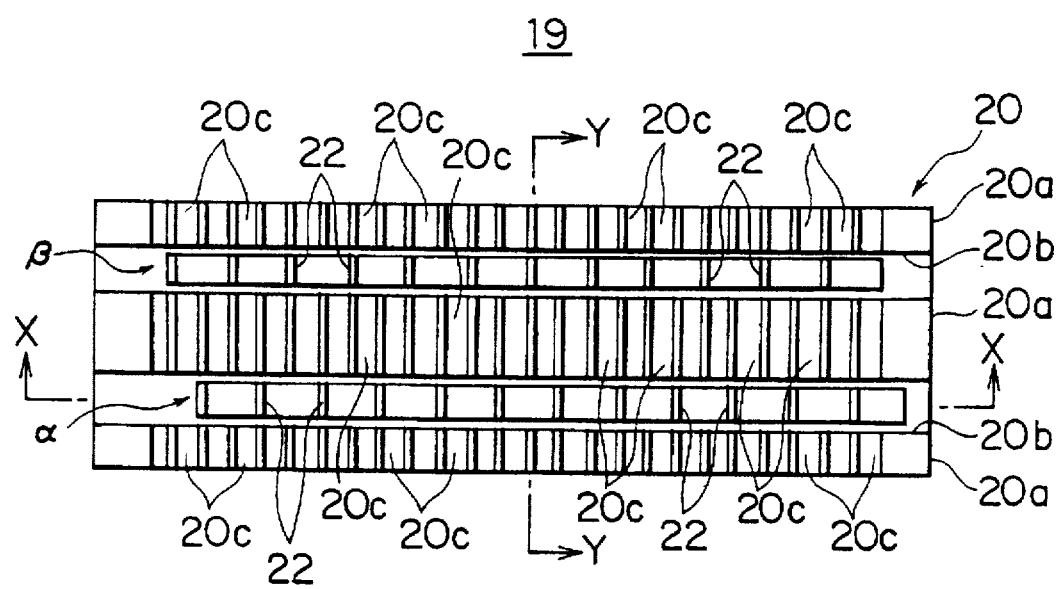
FIG. 6 is a plan view illustrating a wafer loading means in an apparatus for transferring semiconductor silicon wafers according to the second invention.
Figure 7:
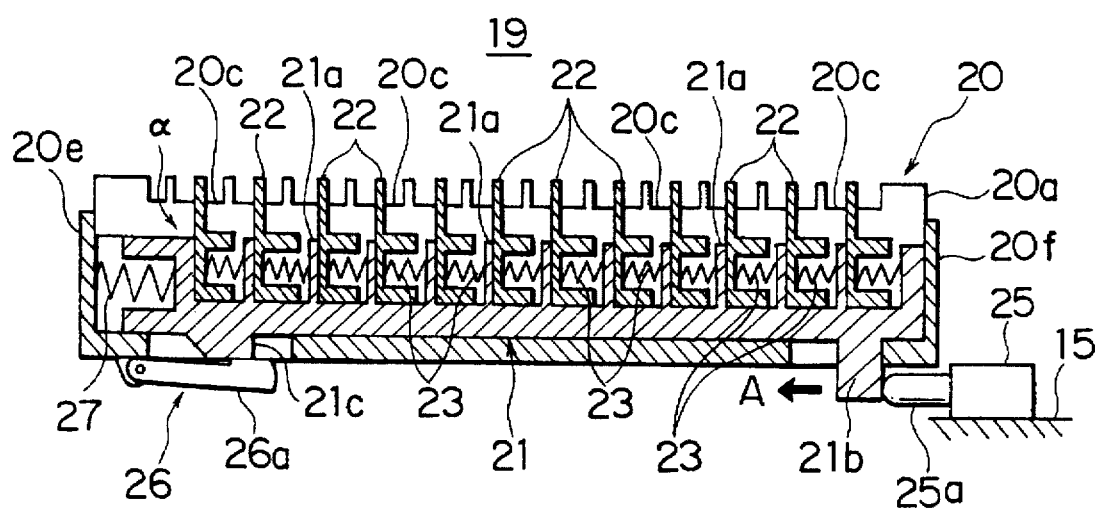
FIG. 7 is a vertical sectional view cut along the line X—X in FIG. 6.
Figure 8:
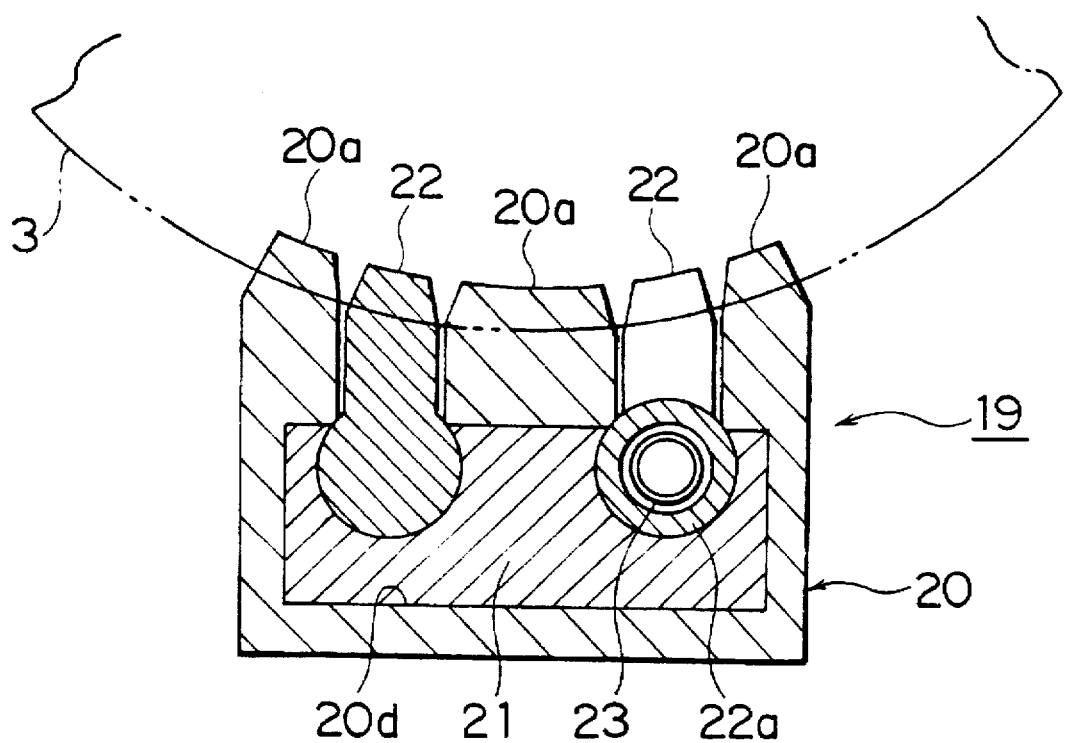
FIG. 8 is a vertical sectional view cut along the line Y—Y in FIG. 6.
Figure 9:
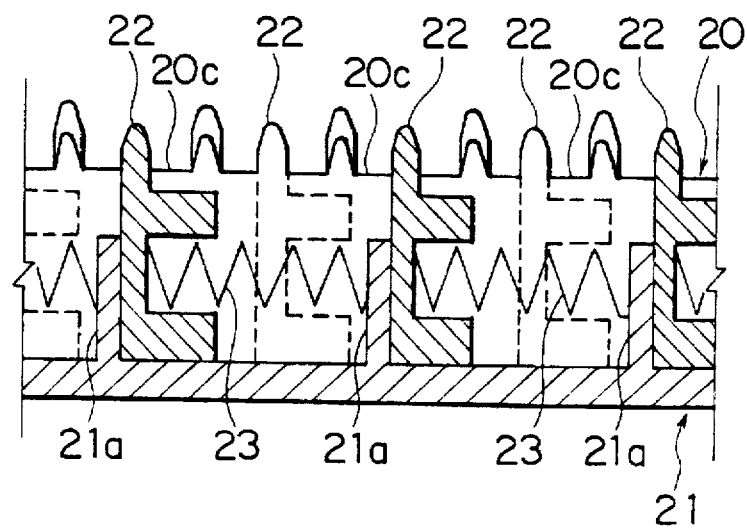
FIG. 9 is a partially enlarged sectional view illustrating a plurality of pressing members and a plurality of elastic means of the wafer loading means in the apparatus according to the second invention.
Figure 10:
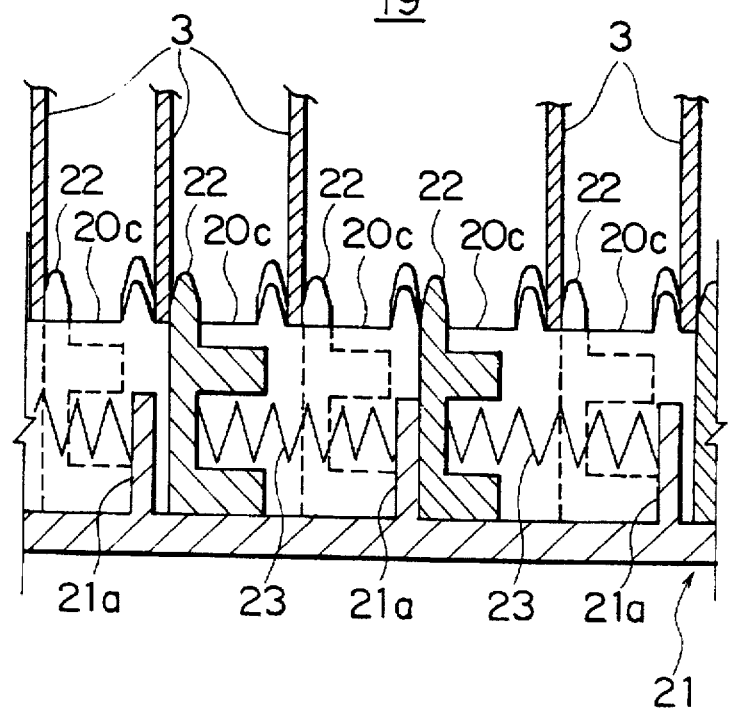
FIG. 10 is a partially enlarged sectional view illustrating a state of gripping of the wafers in the wafer loading means shown in FIG. 9.

FIG. 6 is a plan view illustrating a wafer loading means in an apparatus for transferring semiconductor silicon wafers according to the second invention; FIG. 7 is a vertical sectional view cut along the line X—X in FIG. 6; FIG. 8 is a vertical sectional view cut along the line Y—Y in FIG. 6; FIG. 9 is a partially enlarged sectional view illustrating a plurality of pressing members and a plurality of elastic means of the wafer loading means in the apparatus according to the second invention; and FIG. 10 is a partially enlarged sectional view illustrating a state of gripping of the wafers in the wafer loading means shown in FIG. 9.

The apparatus for transferring semiconductor silicon wafers according to the second invention is identical with the apparatus B for transferring semiconductor silicon wafers according to the first invention described above, except that a wafer loading means 19 of the present invention is fixed onto the uppermost end 10a of the push-rod 10, that the positioning means 24 is not provided therefore between the uppermost end 10a of the push-rod 10 and the wafer loading means 19, that there is therefore neither provided the steps 11c on the both sides of the lower portion of the wafer loading means 19 nor formed the recesses 13a for receiving the above-mentioned steps 11c on the free ends of the pair of supporting arms 13 of the holding mechanism 12, and that the wafer loading means 19 comprises a grip body 20 having a plurality of parallel grooves 20c on an upper face thereof, a sliding plate 21 fitted to the grip body 20 slidably in a direction at right angles to the plurality of parallel grooves 20c, a plurality of pressing members 22, provided on the sliding plate 21, each for pressing the lower portion of each of the wafers 3 against one of both side walls of each of the plurality of parallel grooves 20c, and a plurality of elastic means 23 each for individually imparting a pressing force to each of the plurality of pressing members 22, so as to prevent the occurrence of a fine vibration of each of the wafers in each of the plurality of parallel grooves 20c. Descriptions concerning the components common to these two apparatuses such as the push-rod 10, the holding mechanism 12, the cassette replacing mechanism 14 and the base 15 are therefore omitted.

The wafer loading means 19 fixed onto the uppermost end 10a of the push-rod 10 comprises, as described above, the grip body 20, the sliding plate 21, the plurality of pressing members 22 and the plurality of elastic means 23.

The grip body 20 has three guide blocks, i.e., the first to third guide blocks 20a formed on the both sides and at the center thereof in the form of upward projections, as shown in FIG. 6. Two guide grooves 20b are formed each between these three blocks 20a, i.e., between the first and second guide blocks 20a, and between the second and third guide blocks 20a. A plurality of parallel grooves 20c are formed at equal intervals and at equal pitches on each of these three guide blocks 20a. The respective plurality of parallel grooves 20c formed on the three guide blocks 20a align with each other. Each of the plurality of parallel grooves 20c has a width slightly larger than the thickness of the wafers 3, thereby facilitating the receiving of the wafers 3 into the plurality of parallel grooves 20c.

As shown in FIG. 8, the grip body 20 has therein a sliding groove 20d extending in the longitudinal direction, which communicates with the two guide grooves 20b described above.

The sliding plate 21 is arranged, as shown in FIGS. 7 and 8, in the sliding groove 20d of the grip body 20 so as to be reciprocatively slidable along the sliding groove 20d in a direction at right angles to the plurality of parallel grooves 20c of the three guide blocks 20a. A plurality of partition plates 21a are fixed onto the upper face of the sliding plate 21 so as to form two parallel rows α and β in the longitudinal direction of the sliding plate 21. The positions of the two parallel rows α and β each comprising the plurality of partition plates 21a, agree with the positions of the above-mentioned two guide grooves 20b between the three guide blocks 20a, respectively. The plurality of parallel grooves 20c of the three guide blocks 20a of the grip body 20 are formed at of a pitch of a half of that of the plurality of partition plates 21a forming the two parallel rows α and β. In addition, the plurality of partition plates 21a in the row α are arranged at positions displaced from the plurality of partition plates 21a in the other row β by a distance of half the pitch of the plurality of partition plates 21a of these rows α and β. A spring 27 is arranged between one end of the sliding plate 21, i.e., the left end thereof in FIG. 7, and a leading end wall 20e of the grip body 20. Under the action of the spring 27, the sliding plate 21 is pressed against a tail end wall 20f of the grip body 20.

Each of the plurality of pressing members 22 is integrally provided in the lower portion thereof with a cylindrical spring shoe 22a, as shown in FIG. 8. The plurality of pressing members 22 having such a construction are arranged one in each of a plurality of gaps between the plurality of partition plates 21a fixed onto the sliding plate 21, as shown in FIG. 7.

Each of the plurality of elastic means 23 comprises a metallic coil spring. An end of each elastic means 23 is inserted into the cylindrical spring shoe 22a of each of the above-mentioned plurality of pressing members 22, and the other end of each elastic means 23 is in contact with each of the plurality of partition plates 21a of the sliding plate 21. Each of the plurality of elastic means 23 thus individually imparts a pressing force to each of the plurality of pressing members 22. While each of the plurality of elastic means 23 has been described above as comprising a metallic coil spring, any shape or material may be used so far as a pressing force can be individually imparted to each of the plurality of pressing members 22. A metallic plate spring or a block comprising an elastic body such as rubber, for example, may be used as the elastic means 23.

A downward projection 21b is formed at a right side position in FIG. 7 on the lower face of the above-mentioned sliding plate 21. In the proximity to the replacing position on the upper face 15a of the base 15, an actuator 25 such as a hydraulic cylinder, a pneumatic cylinder or a servomotor is arranged, as shown in FIG. 7. The actuator 25 presses a free end of a rod 25a against the downward projection 21b of the sliding plate 21, to cause the sliding plate 21 to slide together with the plurality of pressing members 22, in the arrow A direction in FIG. 7 against elasticity of the spring 27.

Furthermore, the grip body 20 of the above-mentioned wafer loading means 19 is provided with a locking mechanism 26 for locking the sliding plate 21 at a prescribed position, when the sliding plate 21 has slid in the arrow A direction in FIG. 7 to that prescribed position. The locking mechanism 26 comprises, as shown in FIG. 7 a hook 26a rotatably connected to the lower face of the grip body 20, and a stopper 21c downwardly projecting from the lower face of the sliding plate 21, which engages with the above-mentioned hook 26a. More specifically, the locking means 26, having such a construction, locks the sliding plate 21 at a prescribed position in a state in which the wafers 3 are received in the plurality of parallel grooves 20c of the grip body 20 of the wafer loading means 19, when the sliding plate 21 has slid to that prescribed position, thereby maintaining the state in which the pressing force is individually imparted to the plurality of pressing members 22 by means of the plurality of elastic means 23. The locking of the sliding plate 21 to the grip body 20 and the releasing thereof by means of the locking mechanism 26 are accomplished by means of a similar actuator to the above-mentioned actuator 25.

The above-mentioned wafer loading means 19 is fixed onto the uppermost end 10a of the push-rod 10.

Steps for transferring in a lump the wafers 3 from the first cassette 4, which contains the wafers 3 inserted therein, to the second cassette 5 by the use of the apparatus according to the second invention, in which the above-mentioned wafer loading means 19 is fixed onto the uppermost end 10a of the push-rod 10, are the same as the steps for transferring the wafers 3 from the first cassette 4 to the second cassette 5 by the use of the apparatus of the prior art 1 described above with reference to FIGS. 11(a) to (f), except that the lower portions of the wafers 3 are gripped by means of the plurality of the pressing members 22 of the sliding plate 21 of the wafer loading means 19. The steps for transferring the wafers 3 from the first cassette 4 to the second cassette 5 by the use of the apparatus according to the second invention are therefore described below with reference to FIGS. 11(a) to 11(f) and FIGS. 6 to 10.

Figure 11A:
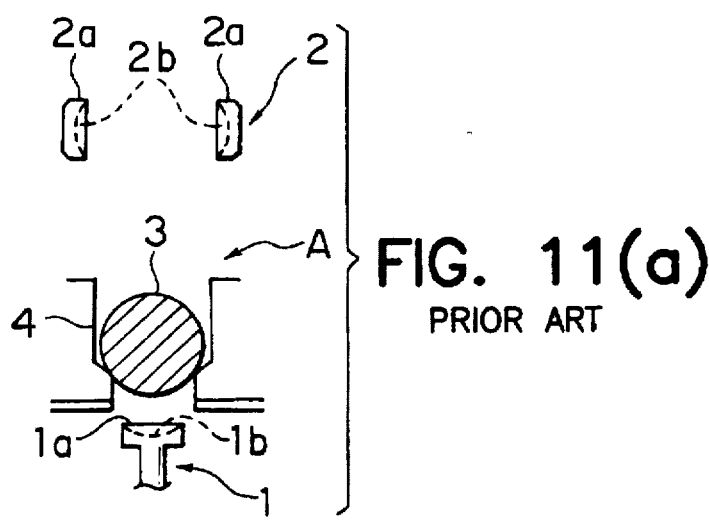
FIGS. 11(a) to (f) are schematic descriptive views illustrating steps for transferring in a lump the wafers, which have been inserted into a first cassette, to a second cassette by the use of an apparatus of the prior art 1.

A plurality of wafers 3 after completion of a prescribed treatment are inserted vertically and in parallel with each other into the first cassette 4. The first cassette 4 into which the wafers 3 have thus been inserted is transported onto the first sliding table 17 placed at the first cassette standby position on the upper face 15a of the base 15. The thus transported first cassette 4 is then moved together with the first sliding table 17, as shown in FIG. 11(a), from the first cassette standby position to the replacing position by means of the cassette replacing mechanism 14 (refer to FIGS. 1 to 3). In this stage, the push-rod 10 (corresponding to the push-rod 1) is moved down to the lowermost position thereof as shown in FIG. 11(a), and the uppermost end 10a of the push-rod 10 and the wafer loading mechanism 19 are positioned below the opening 15c in the upper face of the base 15.

Figure 11B:
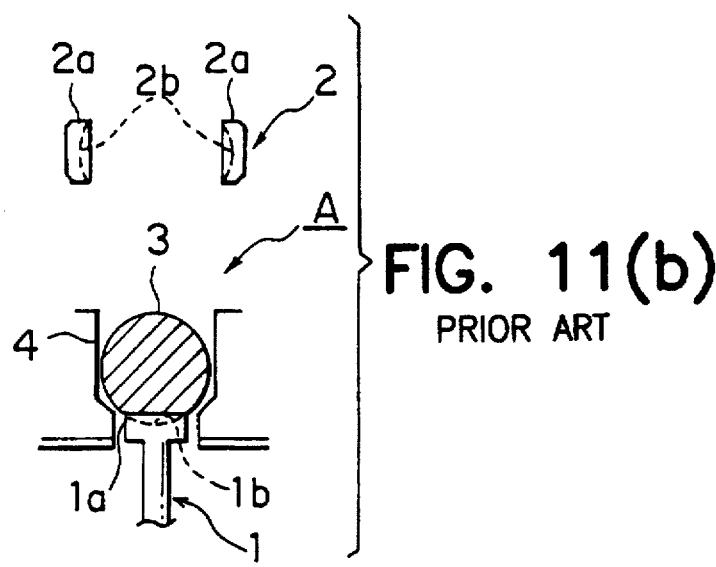
Figure 11C:
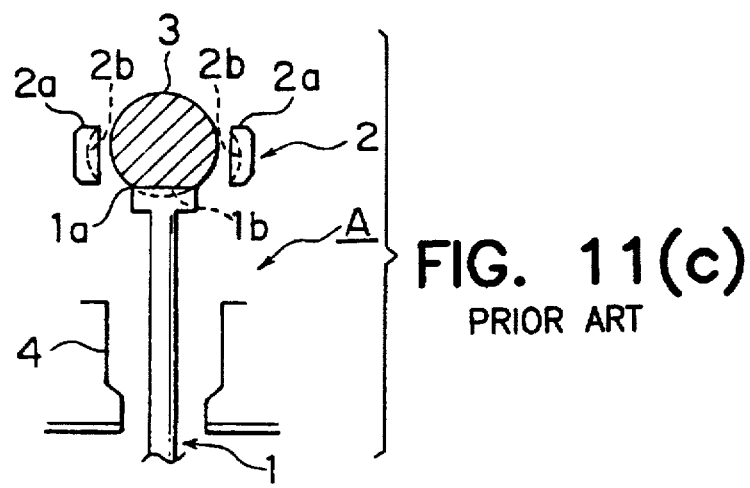
Figure 11D:
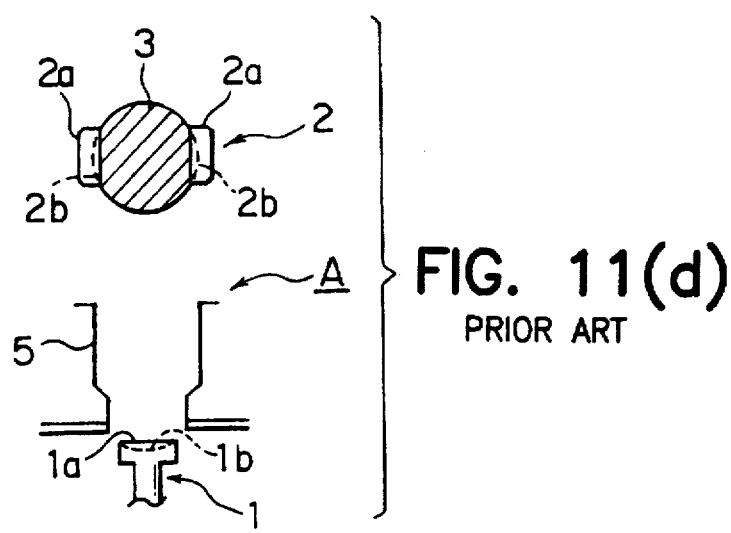

Then, the push-rod 10 is moved up to cause the plurality of parallel grooves 20c (corresponding to the grooves 1b) of the wafer loading means 19 (corresponding to the wafer loading means 1a), fixed onto the uppermost end 10a of the push-rod 10, to receive the lower portions of the wafers 3 (refer to FIG. 11(b)). In this state, the actuator 25 shown in FIG. 7 is operated to cause the free end of the rod 25a of the actuator 25 to press the downward projection 21b of the sliding plate 21 so that the sliding plate 21 slides together with the plurality of pressing members 22 in the arrow A direction in FIG. 7 against elasticity of the spring 27, and the hook 26a of the locking mechanism 26 of the wafer loading means 19 is engaged with the stopper 21c downwardly projecting from the lower face of the sliding plate 21. The lower portion of each of the plurality of wafers 3 is thus gripped between one of both side walls of each of the plurality of parallel grooves 20c of the wafer loading means 19 and each of the plurality of pressing members 22 under the effect of the individual pressing force of each of the plurality of elastic means 23.

Then, the actuator 25 is operated to cause the free end of the rod 25a of the actuator 25 to draw in. Then, the push-rod 10 is further moved up to push out in a lump the wafers 3 upward from the first cassette 4 to a prescribed position (refer to FIG. 11(c)).

Then, the holding mechanism 2 is operated to bring the free ends of the pair of supporting arms 2a closer to each other, so as to grip the both side portions of the wafers 3 between the plurality of parallel grooves 2b on the free ends of the pair of supporting arms 2a. The wafer 3 pushed out upward from the first cassette 4 are thus held at the prescribed position (refer to FIG. 11(d)).

In this state, the hook 26a of the locking mechanism 26 of the wafer loading means 19 is disengaged from the stopper 21c of the sliding plate 21. Thus, the sliding plate 21 slides in a direction opposite to the arrow A direction in FIG. 7 under the effect of elasticity of the spring 27, together with the plurality of pressing members 22, thereby releasing the gripping of the lower portions of the wafers 3 by means of the pressing members 22 of the wafer loading means 19.

Then, the push-rod 10 is moved down, together with the wafer loading means 19, to the lowermost position thereof. Then, the first cassette 4 is moved, together with the first sliding table 17, from the replacing position to the first cassette standby position by means of the cassette replacing mechanism 14, and then, a vacant second cassette 5 placed on the second cassette sliding table 18 is moved, together with the second sliding table 18, from the second cassette standby position to the replacing position, thereby replacing the first cassette 4 with the second cassette 5 (refer to FIG. 11(d)).

Figure 11E:
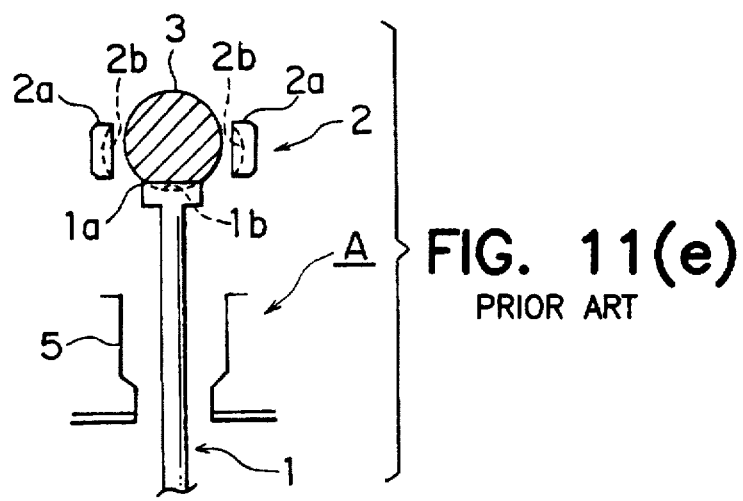
Figure 11F:
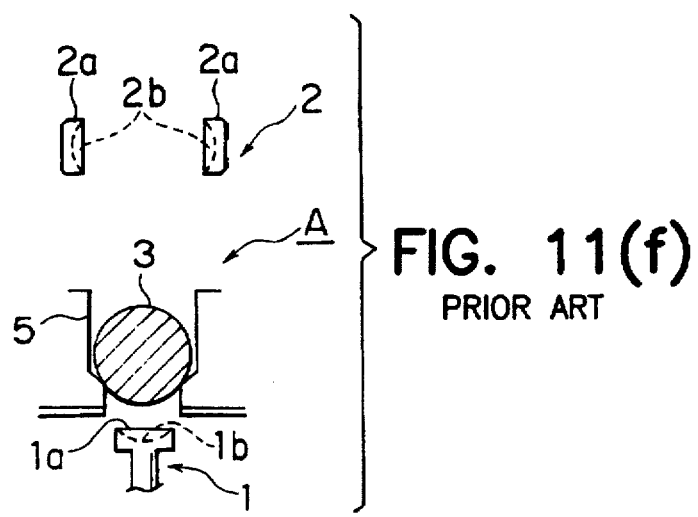

Then, the push-rod 10 is moved up again to receive the lower portions of the wafers 3 held at the above-mentioned prescribed position into the plurality of parallel grooves 20c of the wafer loading means 19 fixed onto the uppermost end 10a of the push-rod 10 (refer to FIG. 11(e)). In this state, the actuator 25 shown in FIG. 7 is operated to cause the free end of the rod 25a of the actuator 25 to press the downward projection 21b of the sliding plate 21 so that the sliding plate 21 slides together with the plurality of pressing members 22 in the arrow A direction in FIG. 7 against elasticity of the spring 27, and the hook 26a of the locking mechanism 26 of the wafer loading means 19 is engaged with the stopper 21c downwardly projecting from the lower face of the sliding plate 21. The lower portion of each of the plurality of wafers 3 is thus gripped between one of both side walls of each of the plurality of parallel grooves 20c of the wafer loading means 19 and each of the plurality of pressing members 22 under the effect of the individual pressing force of each of the plurality of elastic means 23.

In this state, the holding mechanism 2 is operated to bring the free ends of the pair of supporting arms 2a apart from each other, thereby releasing the gripping of the both side portions of the wafers 3 by means of the free ends of the pair of supporting arms 2a (refer to FIG. 11(e)).

Then, in the state in which the plurality of parallel grooves 20c of the wafer loading means 19 receive the lower portions of the wafers 3, the push-rod 10 is moved down together with the wafer loading means 19 to insert in a lump the wafers 3 into the plurality of parallel grooves 5b of the second cassette 5. Then, the hook 26a of the locking mechanism 26 of the wafer loading means 19 is disengaged from the stopper 21c of the sliding plate 21. Thus, the sliding plate 21 slides in a direction opposite to the arrow A direction in FIG. 7 under the effect of elasticity of the spring 27, together with the plurality of pressing members 22, thereby releasing the gripping of the lower portions of the wafers 3 by means of the pressing members 22 of the wafer loading means 19. Then, the push-rod 10 is further moved down to the lowermost position thereof, thus transferring in a lump the wafers 3 from the first cassette 4 to the second cassette 5 (refer to FIG. 11(f)).

According to the above-mentioned apparatus for transferring semiconductor silicon wafers according to the second invention, when transferring the wafers 3 from the first cassette 4, which contains the wafers 3 inserted therein, to the second cassette 5, the lower portion of each of the plurality of wafers 3 is gripped between one of both side walls of each of the plurality of parallel grooves 20c of the wafer loading means 19 and each of the plurality of pressing members 22 under the effect of the individual pressing force of each of the plurality of elastic means 23. Therefore, even when the push-rod 10 vibrates during the up or down movement thereof, an unstable fine vibration of the wafers 3 in the plurality of parallel grooves 20c of the wafer loading means 19 can be avoided. As a result, it is possible to prevent the production of dust caused by friction between the lower portions of the wafers 3 and the wafer loading means 19, thereby making it possible to solve the above-mentioned problem 1 of the prior art 1. As a result, even when the push-rod 10 is moved up or down at a higher speed, it is possible to inhibit the production of dust and to improve the fabrication efficiency of the semiconductor silicon wafers, thereby solving also the problem 2 of the prior art 1.

In the above-mentioned wafer loading means 19, furthermore, the lower portion of each of the plurality of wafers 3 is gripped between one of both side walls of each of the plurality of parallel grooves 20c of the wafer loading means 19 and each of the plurality of pressing members 22 under the effect of the individual pressing force of each of the plurality of elastic means 23. It is not therefore necessary to strictly control the fabrication accuracy of the plurality of parallel grooves 20c of the wafer loading means 19. As shown in FIG. 10, furthermore, even when a wafer 3 is not inserted into any one of the plurality of parallel grooves 20c of the wafer loading means 19, this never affects the gripping of the lower portions of the other wafers 3, thereby solving the problem of the prior art 2.

In the above-mentioned wafer loading means 19 of the apparatus for transferring semiconductor silicon wafers according to the second invention, the plurality of partition plates 21a fixed onto the upper face of the sliding plate 21 in the row α are arranged at positions displaced from the plurality of partition plates 21a fixed onto the upper face of the sliding plate 21 in the other row β by a distance of half the pitch of the plurality of partition plates 21a, and the plurality of pressing members 22 are arranged respectively in a plurality of gaps between the plurality of partition plates 21a thus arranged. Therefore, the plurality of pressing members 22 in the row α on the sliding plate 21 are arranged at positions displaced from the plurality of pressing members 22 in the other row β on the sliding plate 21 by a distance of half the pitch of the plurality of pressing members 22. By adopting this construction, it is possible to reduce the pitch of the plurality of parallel grooves 20c of the wafer loading means 19 to a half of the distance required for arranging each of the plurality of pressing members 22, thereby permitting improvement of the wafer housing capacity without increasing the size of the wafer loading means 19.

The above-mentioned wafer loading means 19 of the apparatus for transferring semiconductor silicon wafers according to the second invention, has so far been described as having the following construction:

(1) The grip body 20 has three guide blocks, i.e., the first to three guide blocks 20a;
(2) Two guide grooves 20b are defined by means of these three guide blocks 20a;
(3) Two parallel rows α and β each comprising a plurality of partition plates 21a are formed respectively in the above-mentioned two guide grooves 20b;
(4) A plurality of parallel grooves 20c of the three guide blocks 20a of the grip body 20 are formed at a pitch of a half that of the plurality of partition plates 21a forming the above-mentioned two parallel rows α and β; and
(5) The plurality of partition plates 21a in the row α are arranged at positions displaced from the plurality of partition plates 21a in the other row β by a distance of half the pitch of the plurality of partition plates 21a.

When it is not necessary to improve the wafer housing capacity of the above-mentioned wafer loading means 19, however, the wafer loading means 19 may have the following construction:

(1) The grip body 20 has two guide blocks, i.e., the first and second guide blocks;
(2) A single guide groove is defined by means of these two guide blocks;
(3) A single row comprising a plurality of partition plates is formed in the above-mentioned single guide groove; and
(4) A plurality of parallel grooves of the two guide blocks of the grip body are formed at a pitch equal to that of a plurality of partition plates forming the above-mentioned single row;

When it is necessary to further improve the wafer housing capacity of the above-mentioned wafer loading means 19, on the other hand, the wafer loading means 19 may have the following construction:

(1) The grip body 20 has four guide blocks, i.e., the first to fourth guide blocks;
(2) Three guide grooves are defined by means of these four guide blocks;
(3) Three parallel rows, i.e., the first to third rows each comprising a plurality of partition plates are formed respectively in the above-mentioned three guide grooves;
(4) A plurality of parallel grooves of the four guide blocks of the grip body 20 are formed at a pitch of a third of that of the plurality of partition plates forming the above-mentioned three parallel rows;
(5) The plurality of partition plates in the first row are arranged at positions displaced in a first direction from the plurality of partition plates in the second row by a distance of a third of the pitch of the plurality of the partition plates; and (6) The plurality of partition plates in the third row are arranged at positions displaced in a direction opposite to the above-mentioned first direction from the plurality of partition plates in the second row by a distance of a third of the pitch of the plurality of the partition plates.

It is possible to further remarkably improve the wafer housing capacity of the above-mentioned wafer loading means 19, if necessary, by increasing the number of the guide blocks of the grip body 20 to at least five, increasing the number of the guide grooves and the number of the rows each comprising the plurality partition plates in the respective guide grooves to at least four, appropriately determining the pitch of the plurality of parallel grooves of the guide blocks of the grip body 20 in the same manner as that described above, and appropriately determining the amount of displacement of the plurality of partition plates of a certain row in a certain guide groove relative to the plurality of partition plates of the other row in the other guide groove.

While the above-mentioned wafer loading means 19 according to the second invention has been described above as being fixed onto the uppermost end 10a of the push-rod 10, the wafer loading means 19 may be used as a substitute for the wafer loading means 11 in the apparatus B for transferring semiconductor silicon wafer according to the first invention. In this embodiment, a step 11c is formed, as shown in FIG. 4, on each of the both sides of the lower portion of the wafer loading means, which step 11c is received into a recess 13a of the free end portion of each of the pair of supporting arms 13 of the holding mechanism 13. In addition, wafer loading means 19 should preferably be fitted releasably onto the uppermost end 10a of the push-rod 10 through a positioning means 24 as shown in FIG. 4. The positioning means 24 comprises a plurality of holes 11b formed in the lower portion of the wafer loading means 19, and a plurality of pins 10b formed on the uppermost end 10a of the push-rod 10.

Now, steps for transferring in a lump the wafers 3 from the first cassette 4, which contains the wafers 3 inserted therein, to the second cassette 5 by the use of the wafer loading means 19 described above with reference to FIGS. 6 to 10 as a substitute for the wafer loading means 11 in the apparatus B for transferring semiconductor silicon wafers according to the first invention, are described below with reference to FIGS. 5(a) to (f) and 6 to 10.

A plurality of wafers 3 after completion of a prescribed treatment are inserted vertically and in parallel with each other into the first cassette 4. The first cassette 4 into which the wafers 3 have thus been inserted is transported onto the first cassette sliding table 17 placed at the first cassette standby position on the upper face 15a of the base 15. The thus transported first cassette 4 is then moved together with the first sliding table 17, as shown in FIG. 5(a), from the first cassette standby position to the replacing position by means of the cassette replacing mechanism 14 (refer to FIGS. 1 to 3). In this stage, the push-rod 10 is moved down to the lowermost position thereof as shown in FIG. 5(a), and the uppermost end 10a of the push-rod 10 and the wafer loading means 19 are positioned below the opening 15c in the upper face 15a of the base 15.

Then, the push-rod 10 is moved up to cause the plurality of parallel grooves 20c of the wafer loading means 19 fitted releasably onto the uppermost end 10a of the push-rod 10 to receive the lower portions of the wafers 3 (refer to FIG. 5(b)). In this state, the actuator 25 shown in FIG. 7 is operated to cause the free end of the rod 25a of the actuator 25 to press the downward projection 21b of the sliding plate 21 so that the sliding plate 21 slides together with the plurality of pressing members 22 in the arrow A direction in FIG. 7 against elasticity of the spring 27, and the hook 26a of the locking mechanism 26 of the wafer loading means 19 is engaged with the stopper 21c downwardly projecting from the lower surface of the sliding plate 21. The lower portion of each of the plurality of wafers 3 is thus gripped between one of both side walls of each of the plurality of parallel grooves 20c of the wafer loading means 19 and each of the plurality of pressing members 22 under the effect of the individual pressing force of each of the plurality of elastic means 23.

Then, the actuator 25 is operated to cause the free end of the rod 25a of the actuator 25 to draw in. Then, the push-rod 10 is further moved up to push out in a lump the wafers 3 upward from the first cassette 4 to a prescribed position (refer to FIG. 5(c)).

Then, the holding mechanism 12 is operated to bring the free ends of the pair of supporting arms 13 closer to each other, so as to receive the steps 11c of the wafer loading means 19 into the recesses 13a of the free ends of the pair of supporting arms 13, and whereby the wafer loading means 19 having received the wafers 3 pushed out upward from the first cassette 4, is held at the prescribed position (refer to FIG. 5(d)).

Then, the push-rod 10 is moved down to separate the uppermost end 10a thereof from the wafer loading means 19 held by means of the free ends of the pair of supporting arms 13, and then, the push-rod 10 is further moved down to the lowermost position thereof. In this stage, the uppermost end 10a of the push-rod 10 is positioned below the opening 15c of the upper face 15a of the base 15. In this state, the wafers 3 pushed out upward from the first cassette 4 are held at the prescribed position by means of the free ends of the pair of supporting arms 13 through the wafer loading means 19, without coming into direct contact with the pair of supporting arms 13 (refer to FIG. 5(d)).

Then, the first cassette 4 is moved, together with the first sliding table 17, from the replacing position to the first cassette standby position by means of the cassette replacing mechanism 14, and then, a vacant second cassette 5 placed on the second sliding table 18, is moved together with the second sliding table 18, from the second cassette standby position to the replacing position, thereby replacing the first cassette 4 with the second cassette 5 (refer to FIG. 5(d)).

Then, the push-rod 10 is moved up again to fit the pins 10b provided on the uppermost end 10a of the push-rod 10 into the holes 11b formed in the lower portion of the wafer loading means 19. In this state, the holding mechanism 12 is operated to bring the free ends of the pair of supporting arms 13 apart from each other, thereby releasing the support of the steps 11c of the wafer loading means 19 by means of the recesses 13a of the pair of supporting arms 13 (refer to FIG. 5(e)).

Then, the push-rod 10 is moved down, together with the wafers loading means 19 having received the wafer 3, to insert in a lump the wafers 3 into the plurality of parallel grooves 5b of the second cassette 5. In this state, the hook 26a of the locking mechanism 26 of the wafer loading means 19 is disengaged from the stopper 21c of the sliding table 21. Thus, the sliding plate 21 slides in a direction opposite to the arrow A direction in FIG. 7 under the effect of elasticity of the spring 27, together with the plurality of pressing members 22, thereby releasing the gripping of the lower portions of the wafers 3 by means of the pressing members 22 of the wafer loading means 19.

Then, the push-rod 10 is further moved down together with the wafer loading means 19 to the lowermost position thereof. In this stage, the uppermost end 10a of the push-rod 10 is positioned, together with the wafer loading means 19, below the opening 15c of the upper face 15a of the base 15, whereby the wafers 3 are transferred in a lump from the first cassette 4 to the second cassette 5 (refer to FIG. 5(f)).

The use of the above-mentioned wafer loading means 19 as described above with reference to FIGS. 6 to 10 as a substitute for the wafer loading means 11 in the apparatus B for transferring semiconductor silicon wafers according to the first invention, brings about the following effects:

(1) When transferring the wafers 3 from the first cassette 4, which contains the wafers 3 inserted therein, to the second cassette 5, the lower portion of each of the plurality of wafers 3 is gripped between one of both side walls of each of the plurality of parallel grooves 20c of the wafer loading means 19 and each of the plurality of pressing members 22 under the effect of the individual pressing force of each of the plurality of elastic means 23. The above-mentioned problem 1 of the prior art 1 can therefore be solved;

(2) As a result, even when the push-rod 10 is moved up or down at a higher speed, the production of dust can be inhibited, and the fabrication efficiency of the semiconductor silicon wafers can be improved. The above-mentioned problem 2 can the prior art 1 can therefore be solved;

(3) The wafer loading means 19 is releasably fitted onto the uppermost end 10a of the push-rod 10. In addition, except for two steps including the first step of receiving the wafers 3 into the wafer loading means 19 and the final step of withdrawing the wafers 3 from the wafer loading means 19, the wafers 3 always move together with the wafer loading means 19, and during this move, receiving of the wafers 3 into the wafer loading means 19 and withdrawing of the wafers 3 therefrom are never carried out throughout the steps of transferring the wafers 3 from the first cassette 4, which contains the wafers 3 inserted therein, to the second cassette 5. More specifically, when transferring the wafers 3 from the first cassette 4, which contains the wafers 3 inserted therein, to the second cassette 5, the receiving frequency of the wafers 3 into the plurality of parallel grooves 20c of the wafer loading means 19 and the withdrawing frequency of the wafers 3 from the plurality of parallel grooves 20c are only once, respectively, which represents a half of the frequency in the prior art 1. It is thus possible to solve the problem 3 of the prior art 1;

(4) The wafers 3 pushed out upward from the first cassette 4 are held at the prescribed position by means of the pair of supporting arms 13 through the wafer loading means 19, without coming into direct contact with the pair of supporting arms 13. The problem 4 of the prior art 1 can thus be solved; and (5) The lower portion of each of the plurality of wafers 3 is gripped between one of both side walls of each of the plurality of parallel grooves 20c of the wafer loading means 19 and each of the plurality of pressing members 22 under the effect of the individual pressing force of each of the plurality of elastic means 23. It is not therefore necessary to strictly control the fabrication accuracy of the plurality of parallel grooves 20c of the wafer loading means 19. As shown in FIG. 10, furthermore, even when a wafer 3 is not inserted into any one of the plurality of parallel grooves 20c of the wafer loading means 19, this never affects the gripping of the lower portions of the other wafers 3. It is therefore possible to solve the above-mentioned problem of the prior art 2.

As described above in detail, (a) In the first invention, the wafer loading means is releasably fitted onto the uppermost end of the push-rod. According to the first invention, therefore, it is possible to provide an apparatus for transferring in a lump a plurality of semiconductor silicon wafers from a first cassette, which contains the wafers inserted therein vertically and in parallel with each other, to a second cassette, wherein at least the above-mentioned problems 3 and 4 of the prior art 1can be solved by minimizing the receiving frequency of the wafers into a wafer loading means, the withdrawing frequency of the wafers from the wafer loading means, the gripping frequency of the wafers by means of a holding mechanism, and the releasing frequency of the gripped wafers by means of the holding mechanism, in other words, it is possible to minimize the amount of produced dust caused by friction between the wafers and the wafer loading means and friction between wafers and the holding mechanism; and (b) In the second invention, the wafer loading means fixed onto the uppermost end of the push-rod comprises a grip body having a plurality of parallel grooves formed on an upper face thereof, a sliding plate fitted to the grip body slidably in a direction at right angles to the plurality of parallel grooves, a plurality of pressing members, provided on the sliding plate, each for pressing the lower portion of each of the wafers against one of both side walls of each of the plurality of parallel grooves, and a plurality of elastic means each for individually imparting a pressing force to each of the plurality of pressing members. According to the second invention, therefore, it is possible to provide an apparatus for transferring in a lump a plurality of semiconductor silicon wafers from a first cassette, which contains the wafers inserted therein vertically and in parallel with each other, to a second cassette, wherein at least the above-mentioned problems 1 and 2 of the prior art and the above-mentioned problem of the prior art 2 can be solved by individually gripping the lower portion of each of the wafers in each of the plurality of parallel grooves of the wafer loading means, in other words, it is possible to prevent the production of dust caused by an unstable fine vibration of the wafers in the plurality of parallel grooves of the wafer loading means, and furthermore, the lower portion of each of the wafers can always be gripped under appropriate conditions in each of the plurality of parallel grooves of the wafer loading means, without the need of a very strict fabrication accuracy when fabricating the plurality of parallel grooves on the wafer loading means;

Whereby many industrially useful effects are provided.

What is claimed is:

1. In an apparatus for transferring in a lump a plurality of semiconductor silicon wafers from a first cassette, which contains said wafers inserted therein vertically and in parallel with each other, to a second cassette, which comprises:

a push-rod, movable up and down through an opening provided in a bottom of each of said first cassette and said second cassette, for pushing out in a lump said wafers upward from said first cassette, and inserting in a lump said wafers thus pushed out upward into said second cassette;

a wafer loading means, provided on the uppermost end of said push-rod, said wafer loading means having a plurality of parallel grooves for receiving lower portions of said wafers;

a holding mechanism for supporting in a lump said wafers pushed out upward by means of said push-rod, so as to hold said wafers pushed out upward from said first cassette at a prescribed position; and a cassette replacing mechanism for replacing said first cassette with said second cassette while said wafers are held at said prescribed position by means of said holding mechanism;

whereby said push-rod is moved up to push out in a lump said wafers inserted into said first cassette upward from said first cassette; then said wafers thus pushed out upward are held at said prescribed position by means of said holding mechanism; then, said push-rod is moved down to the lowermost position thereof; then, said first cassette is replaced with said second cassette by means of said cassette replacing mechanism; then, said push-rod is moved up again to receive said wafers held at said prescribed position by means of said holding mechanism through said wafer loading means; then, said holding of said wafers by means of said holding mechanism is released; and then, said push-rod is moved down again to said lowermost position thereof to insert in a lump said wafers into said second cassette, thereby transferring in a lump said wafers from said first cassette to said second cassette;

the improvement wherein:

said wafer loading means (11 or 19) is releasably fitted onto said uppermost end (10a) of said push-rod (10), and said push-rod (10) is moved down while said wafers (3) are held at said prescribed position to separate said wafer loading means (11 or 19) from said uppermost end (10a) of said push-rod (10); and said holding mechanism (12) grips said wafer loading means (11 or 19) without coming into direct contact with said wafers (3), to hold said wafers (3) at said prescribed position.

2. In an apparatus for transferring in a lump a plurality of semiconductor silicon wafers from a first cassette, which contains said wafers inserted therein vertically and in parallel with each other, to a second cassette, which comprises:

a push-rod, movable up and down through an opening provided in a bottom of each of said first cassette and said second cassette, for pushing out in a lump said wafers upward from said first cassette, and inserting in a lump said wafers thus pushed out upward into said second cassette;

a wafer loading means, fixed onto the uppermost end of said push-rod, said wafer loading means having a plurality of parallel grooves for receiving lower portions of said wafers;

a holding mechanism for supporting in a lump said wafers pushed out upward by means of said push-rod, so as to hold said wafers pushed out upward from said first cassette at a prescribed position; and a cassette replacing mechanism for replacing said first cassette with said second cassette while said wafers are held at said prescribed position by means of said holding mechanism;

whereby said push-rod is moved up to push out in a lump said wafers inserted into said first cassette upward from said first cassette; then, said wafers thus pushed out upward are held at said prescribed position by means of said holding mechanism; then, said push-rod is moved down to the lowermost position thereof; then, said first cassette is replaced with said second cassette by means of said cassette replacing mechanism; then, said push-rod is moved up again to receive said wafers held at said prescribed position by means of said holding mechanism through said wafer loading means; then, said holding of said wafers by means of said holding mechanism is released; and then, said push-rod is moved down again to said lowermost position thereof to insert in a lump said wafers into said second cassette, thereby transferring in a lump said wafers from said first cassette to said second cassette;

the improvement wherein:

said wafer loading means (19) comprises a grip body (20) having said plurality of parallel grooves (20c) on an upper face thereof, a sliding plate (21) fitted to said grip body (20) slidably in a direction at right angles to said plurality of parallel grooves (20c), a plurality of pressing members (22), provided on said sliding plate (21), each for pressing said lower portion of each of said wafers (3) against one of both side walls of each of said plurality of parallel grooves (20c), and a plurality of elastic means (23) each for individually imparting a pressing force to each of said plurality of pressing members (22), so as to prevent the occurrence of a fine vibration of each of said wafers (3) in each of said plurality of parallel grooves (20c).

3. An apparatus as claimed in claim 1, wherein:

said wafer loading means (19) comprises a grip body (20) having said plurality of parallel grooves (20c) on an upper face thereof, a sliding plate (21) fitted to said grip body (20) slidably in a direction at right angles to said plurality of parallel grooves (20c), a plurality of press-ing members (22), provided on said sliding plate (21), each for pressing said lower portion of each of said wafers (3) against one of both side walls of each of said plurality of parallel grooves (20c), and a plurality of elastic means (23) each for individually imparting a pressing force to each of said plurality of pressing members (22), so as to prevent the occurrence of a fine vibration of each of said wafers (3) in each of said plurality of parallel grooves (20c).

4. An apparatus as claimed in claim 2 or 3, wherein:

said wafer loading means (19) is provided with a locking mechanism (26) which holds said sliding plate (21) at a prescribed sliding plate position when said sliding plate (21) has slid to said prescribed sliding plate position, so as to maintain a state in which said pressing force is individually imparted to each of said plurality of pressing members (22) by means of each of said plurality of elastic means (23).

5. An apparatus as claimed in claim 1 or 3, wherein:

said wafer loading means (11 or 19) is releasably fitted onto said uppermost end (10a) of said push-rod (10) through a positioning means (24).

6. An apparatus as claimed in claim 5, wherein:

said positioning means (24) comprises at least one hole (11b), which is formed in one side of a lower portion of said wafer loading means (11 or 19) and said uppermost end (10a) of said push-rod (10), and at least one pin (10b), which is formed on the other side of said lower portion of said wafer loading means (11 or 19) and said uppermost end (10a) of said push-rod (10), so as to be fittable into said at least one hole (11b).

* * * * *